(12) United States Patent
Zanuso et al.

(10) Patent No.: US 10,063,366 B2
(45) Date of Patent: Aug. 28, 2018

(54) FAST FREQUENCY HOPPING PHASE LOCKED LOOP

(71) Applicant: QUALCOMM Incorporated, San Diego, CA (US)

(72) Inventors: Marco Zanuso, Encinitas, CA (US); Giovanni Marucci, San Diego, CA (US); Tsai-Pi Hung, San Diego, CA (US); Francesco Gatta, San Diego, CA (US); Bo Sun, Carlsbad, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/269,320

(22) Filed: Sep. 19, 2016

(65) Prior Publication Data

US 2017/0310458 A1    Oct. 26, 2017

Related U.S. Application Data

(60) Provisional application No. 62/327,385, filed on Apr. 25, 2016.

(51) Int. Cl.
| | |
|---|---|
| *H03D 3/24* | (2006.01) |
| *H04L 7/033* | (2006.01) |
| *H04W 72/04* | (2009.01) |
| *H04B 1/40* | (2015.01) |
| *H03L 7/08* | (2006.01) |
| *H03L 7/197* | (2006.01) |
| *H04B 1/713* | (2011.01) |

(52) U.S. Cl.
CPC .............. *H04L 7/0331* (2013.01); *H03L 7/08* (2013.01); *H03L 7/1974* (2013.01); *H04B 1/40* (2013.01); *H04B 1/713* (2013.01); *H04W 72/0453* (2013.01); *H03L 2207/06* (2013.01); *H04B 2201/71353* (2013.01)

(58) Field of Classification Search
CPC ................. H04L 7/033; H04L 27/0014; H04L 2017/0067; H03L 7/0891; H03L 7/093
USPC ........ 375/376, 132, 135, 372; 455/103, 127, 455/307; 327/156
See application file for complete search history.

(56) References Cited

U.S. PATENT DOCUMENTS

| 5,757,238 A | 5/1998 | Ferraiolo et al. |
| 6,016,080 A | 1/2000 | Zuta et al. |
| (Continued) | | |

FOREIGN PATENT DOCUMENTS

| EP | 3016340 A1 | 5/2016 |
| WO | 2017052956 A1 | 3/2017 |

OTHER PUBLICATIONS

Fahim A.M., et al., "A Fast Lock Digital Phase-Locked-Loop Architecture for Wireless Applications", IEEE Transactions on Circuits and Systems-II: Analog and Digital Signal Processing, vol. 50, No. 2, Feb. 2003, pp. 63-72.

(Continued)

*Primary Examiner* — Khai Tran
(74) *Attorney, Agent, or Firm* — Qualcomm Incorporated/Seyfarth Shaw LLP

(57) ABSTRACT

A fast frequency hopping implementation in a phase lock loop (PLL) circuit achieves a PLL lock to a new frequency in a very short period of time. In one instant, frequency allocation at a transceiver is changed. In response, a local oscillator frequency hops to a new center frequency based on the changed frequency allocation. The hopping to the new center frequency is based on two-point modulation of a phase locked loop.

24 Claims, 17 Drawing Sheets

(56) References Cited

U.S. PATENT DOCUMENTS

| | | | |
|---|---|---|---|
| 2008/0137716 A1 | 6/2008 | Lakkis | |
| 2010/0213993 A1* | 8/2010 | Hongo | G01S 7/4008 327/156 |
| 2011/0133794 A1* | 6/2011 | Dunworth | H03L 7/08 327/156 |
| 2011/0170574 A1* | 7/2011 | Ripple | H04B 1/69 375/132 |
| 2012/0154064 A1 | 6/2012 | Kaczynski | |
| 2016/0127160 A1* | 5/2016 | Muhammad | H03L 7/1976 375/260 |
| 2017/0094641 A1 | 3/2017 | Asuri et al. | |

OTHER PUBLICATIONS

Lee J., "A Low-Noise Fast-Lock Phase-Locked Loop with Adaptive Bandwidth Control", IEEE Journal of Solid-State Circuits, vol. 35, No. 8, Aug. 2000, pp. 1137-1145.

Uyanik H.K., et al., "PID-Controlled PLL for Fast Frequency-Hopped Systems", IEEE, System-on-Chip, 2007, DCAS 2007, 6th IEEE Dallas Circuits and Systems Workshop on, Nov. 15-16, 2007, pp. 1-3.

International Search Report and Written Opinion—PCT/US2017/02517—ISA/EPO—dated Jul. 5, 2017.

Lee, et al., "Self-Calibrated Two-Point Delta-Sigma Modulation Technique for RF Transmitters," IEEE Transactions on Microwave Theory and Techniques, Jul. 2010, pp. 1748-1757, vol. 58, No. 7.

Peng, K.C., et al., "High-performance frequency-hopping transmitters using two-point delta-sigma modulation", IEEE Transactions on Microwave Theory and Techniques, Nov. 2004, vol. 52, No. 11, pp. 2529-2535.

Ye D., et al., "A Wide Bandwidth Fractional-N. Synthesizer for LTE with Phase Noise Cancellation Using a Hybrid—$\Delta\Sigma$—DAC and Charge Re-timing", IEEE International Symposium on Circuits and Systems (ISCAS), 2013, May 19, 2013, XP032445884, DOI: 10.1109/ISCAS.2013.6571809, pp. 169-172.

* cited by examiner

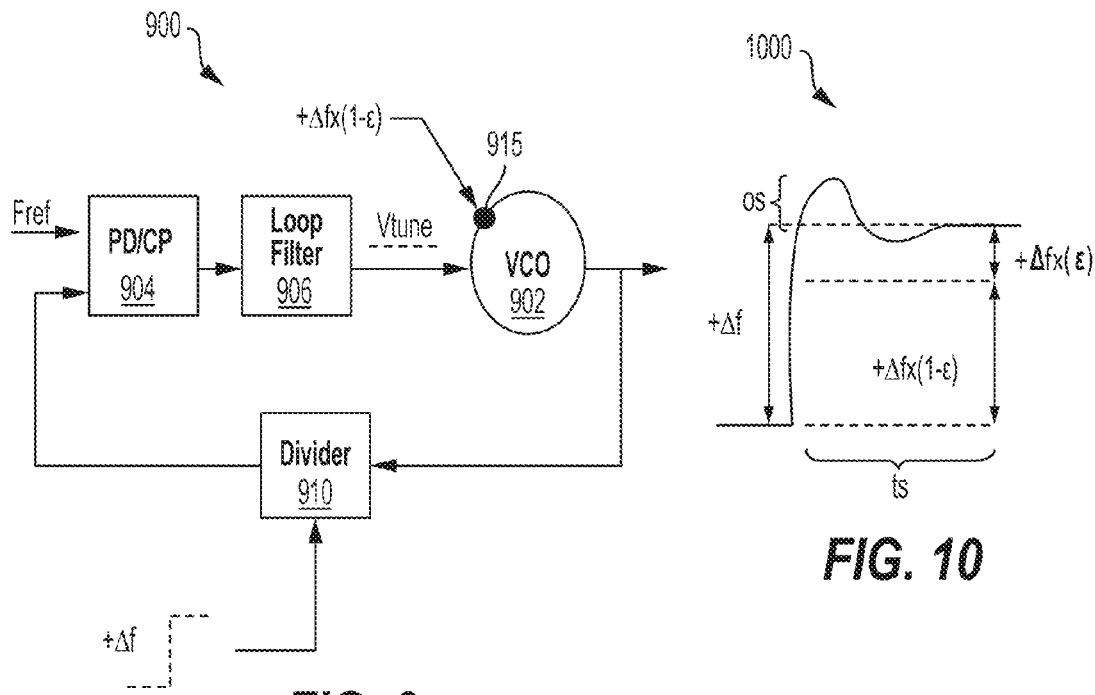
FIG. 9
FIG. 10
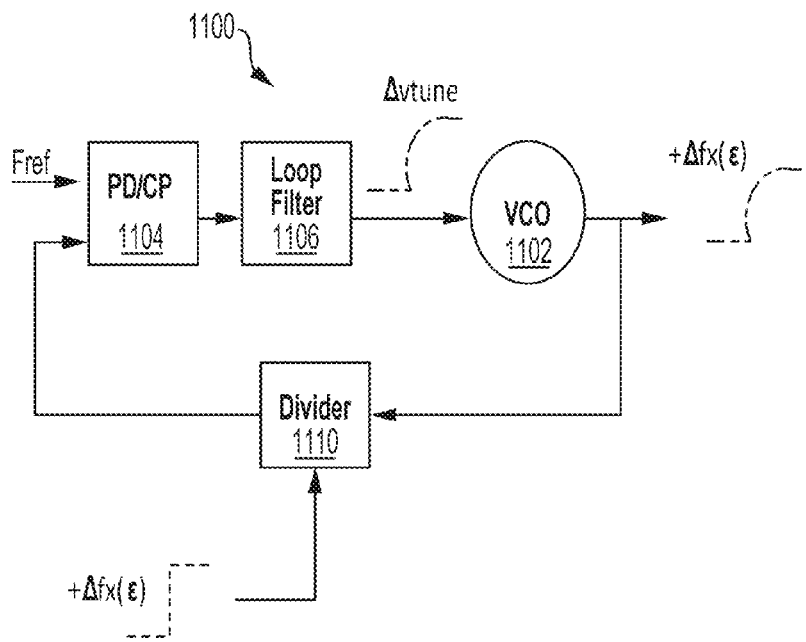
FIG. 11

FAST FREQUENCY HOPPING PHASE LOCKED LOOP

CROSS-REFERENCE TO RELATED APPLICATION

The present application claims the benefit of U.S. Provisional Patent Application No. 62/327,385, filed on Apr. 25, 2016, and titled "FAST FREQUENCY HOPPING PHASE LOCKED LOOP," the disclosure of which is expressly incorporated by reference herein in its entirety.

BACKGROUND

Technical Field

The present disclosure relates generally to wireless communication systems, and more specifically to a fast frequency hopping technique within a phased lock loop.

Related Art

In a long term evolution (LTE) communication network, uplink radio resources may be allocated dynamically to user equipment (UE) based on different applications, data rates, and quality of service (QoS) specifications. Specifically, a UE in an LTE communication network may be allocated varying numbers of resource blocks (RBs) for uplink transmissions from the UE. Each RB may extend over one slot period (e.g., 0.5 milliseconds (ms)) in the time domain while occupying a certain range (e.g., 180 kilohertz (kHz)) in the frequency domain. The RB allocation for a UE may vary in both bandwidth and frequency range between consecutive LTE sub-frames (e.g., two 0.5 ms slot periods). Based on the RB allocation, the UE may transmit data at the center frequency of the allocated RBs.

A conventional transmit path may include a frequency mixer that modulates a carrier signal from a local oscillator (LO) with a modulating signal from a baseband filter (BBF) representing the data to be transmitted. The carrier signal may have a fixed frequency that is relatively high. By contrast, the frequency of the modulating signal may be at the baseband (e.g., near zero hertz). Moreover, the frequency of the modulating signal may be varied in order to achieve an output signal at the center frequency of the allocated RBs. Up-converting the modulating signal from the baseband to the frequency of the carrier signal may give rise to spurious signal emissions including for example, but not limited to, residual sideband (RSB) signals and intermodulation (IM) products (e.g., primary and second 4FMOD signals).

In particular, when RB allocation is narrow (e.g., one RB), the operation of a conventional transmit path may generate spectral emission masks (SEMs) that fall outside of the frequency band allocated to a UE and interfere with transmissions on other channels. A UE may adopt additional maximum power reduction (AMPR) parameters in order to suppress spurious signal emissions to conform to $3^{rd}$ Generation Partnership Project (3GPP) LTE specifications. However, adoption of AMPR parameters may reduce the output power of the UE and thus limit the UE's coverage area.

SUMMARY

In an aspect of the present disclosure, a method for wireless communication is presented. The method includes changing a frequency allocation at a transceiver. The method also includes hopping a local oscillator frequency to a new center frequency based on the changed frequency allocation. The hopping to the new center frequency is based on two-point modulation of a phase locked loop.

In another aspect of the present disclosure, an apparatus for wireless communication is presented. The apparatus includes a local oscillator and a phase detector coupled to the local oscillator. The local oscillator is operable to receive a reference frequency for a transceiver. The apparatus further includes a voltage controlled oscillator (VCO) coupled to the phase detector. In addition, the apparatus includes a frequency divider coupled to the VCO and to the phase detector to complete a feedback loop of a phase locked loop. Furthermore, the apparatus includes a control unit coupled to the local oscillator. The control unit is operable to determine a change in frequency allocation at the transceiver. The control unit is also operable to cause the local oscillator to hop from the reference frequency to a new center frequency based on the changed frequency allocation. The hopping to the new center frequency is based on two-point modulation of the phase locked loop.

In a further aspect of the present disclosure, an apparatus for wireless communication is presented. The apparatus includes means for generating a phase locked loop reference frequency (e.g., a reference PLL frequency, which is based on an original reference frequency from a crystal). The apparatus also includes means for detecting a phase difference between a first frequency and a second frequency. The phase locked loop reference frequency generating means is operable to receive an original reference frequency for a transceiver. The apparatus further includes voltage controlled oscillator (VCO) coupled to the phase detector. In addition, the apparatus includes a frequency divider coupled to the VCO and to the phase detector to complete a feedback loop of the phase locked loop. Furthermore, the apparatus includes a control unit coupled to the local oscillator. The control unit is operable to determine a change in frequency allocation at the transceiver. The control unit is also operable to cause the local oscillator to hop from the original reference frequency to a new center frequency based on the changed frequency allocation. The hopping to the new center frequency is based on two-point modulation of the phase locked loop.

Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

Aspects and features of the present disclosure will be more apparent by describing example aspects with reference to the accompanying drawings, in which:

FIG. 9 illustrates another phase lock loop (PLL) system that achieves fast frequency hopping according to aspects of the present disclosure.

FIG. 10 illustrates a timing diagram of a two point injection implementation according to aspects of the present disclosure.

FIG. 11 illustrates yet another phase lock loop (PLL) system that achieves fast frequency hopping according to aspects of the present disclosure.

DETAILED DESCRIPTION

Figure 1:
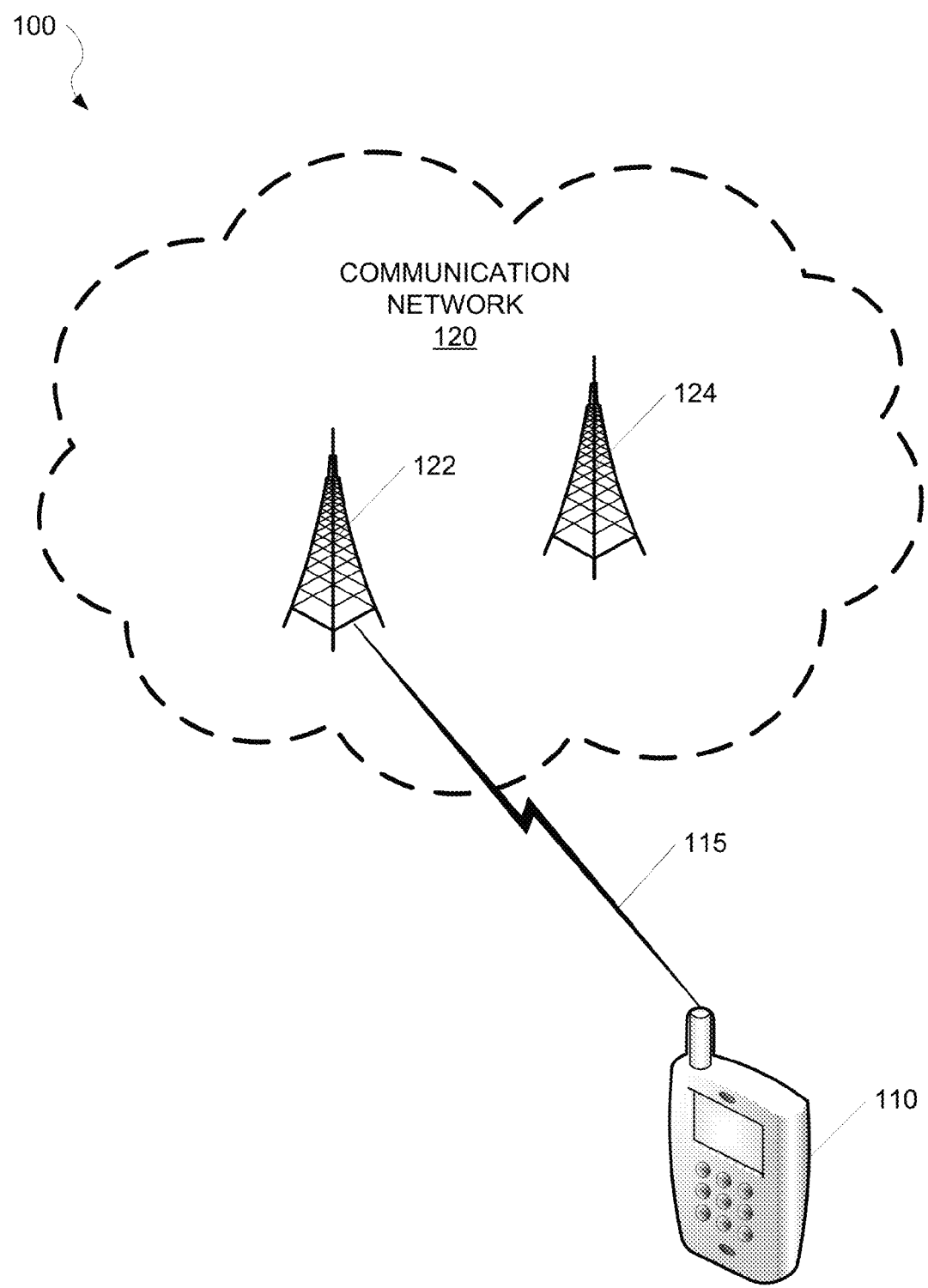
FIG. 1 is a system diagram illustrating a network environment according to various aspects of the present disclosure.

While a number of aspects are described herein, these aspects are presented by way of example only, and are not intended to limit the scope of protection. The apparatuses and methods described may be embodied in a variety of other forms. Furthermore, various omissions, substitutions, and changes in the form of the example apparatuses and methods may be made without departing from the scope of protection.

A phase locked loop (PLL) circuit is often an important component of a device that is designed to operate in a wireless communication system. The PLL forces an oscillator of the PLL circuit (e.g., a voltage controlled oscillator (VCO), digital controlled oscillator, temperature controlled oscillator or the like) to replicate and track a reference frequency and phase at an input when the PLL is in lock configuration. When locked, the frequencies of the input (e.g., at a phase detector) and output (e.g., at a VCO) are tracked exactly (e.g., input frequency=output frequency). A phase offset, however, may exist between the input and output.

A PLL reference frequency may be derived from a local oscillator (e.g., crystal oscillator, (XO)). For example, a frequency of the crystal oscillator may be around tens of megahertz (MHz) while a frequency of the VCO may be specified to generate a periodic signal in the GHz range. In this case, a frequency divider by N is interposed between the VCO and the phase detector. When locked, the frequency at an output of the PLL (e.g., at a VCO) tracks exactly at N times the frequency at an input of the PLL (e.g., at a phase detector). For example, N*input frequency is equal to the output frequency. Thus, the output frequency of the VCO is set at a fractional multiple of the frequency by the frequency divider. Accordingly, the frequency divider modulus control might be scrambled by a digital delta-sigma modulator (DSM). The VCO output can be used as a local oscillator or to generate a clock signal for a digital system.

To achieve fast frequency hopping in a PLL circuit, it is desirable to achieve a PLL lock to a new frequency in a very short period of time. A settling time specifies how fast the PLL arrives at the new frequency when changing or hopping frequencies. Because the PLL is a feedback system having limited bandwidth, the PLL frequency does not change instantaneously. Because the PLL lock time is a bottleneck in PLL implementations, numerous methods exist to improve the settling time. One method is to dynamically adapt the PLL bandwidth. For example, a wide bandwidth (e.g., wide loop filter bandwidth) may be used during the PLL lock to achieve a faster settling time. The bandwidth of the PLL is in tradeoff of integral phase noise (IPN) performance, which is a specification for cellular communications. Loop bandwidth expansion according to the specification is limited. According, the frequency jump may be limited by the bandwidth of the PLL. Therefore, the method directed to dynamically adapting the PLL bandwidth can reduce the settling time without IPN degradation.

Dynamic change of the loop filter components (for example to adjust the bandwidth), however, may be subject to generation of undesirable noise (e.g., phase noise) performance and spurs (e.g., spurious signal emissions). For instance, any glitch caused by a change in the loop filter components will be recovered by the PLL with the final narrow loop-bandwidth, thus limiting the overall settling time. Accordingly, it is desirable to achieve fast frequency hopping while reducing settling time without dynamically adjusting PLL bandwidth.

Aspects of the present disclosure are directed to a phase locked loop (PLL) implementation that achieves fast frequency hopping. The fast frequency hopping PLL implementation may be based on a two-point modulation to reduce settling time without widening PLL loop bandwidth. In one aspect of the disclosure, a PLL feedback system includes a voltage controlled oscillator (VCO), a phase detector, a loop filter (e.g., low pass filter), a control unit (not shown) and a frequency divider (e.g., integer-N synthesizer or fractional synthesizer). The PLL system may be integrated in a mobile communication device. For example, the PLL system may be implemented in a radio frequency (RF) module of the mobile communication device.

The phase detector may be coupled to the loop filter, the loop filter may be coupled to the VCO, the VCO may be coupled to the frequency divider and the frequency divider may be coupled to the phase detector to form the feedback loop (closed loop). The output of the VCO may be a frequency sinusoid that is controlled by a tuning voltage, Vtune, which is received by the VCO from the loop filter. For example, changing the tuning voltage changes the frequency of the VCO. To synthesize a desirable or exact frequency of the VCO, the VCO is included in the closed loop to feed back the VCO signal to the frequency divider. The phase detector compares an output of the frequency divider with a signal that is generated by the local oscillator.

For example, if the reference frequency of the crystal oscillator is at 40 MHz and the output of the VCO is at 4 GHz, the frequency divider receives the 4 GHz output of the VCO and is programmed to divide by 100 to provide an output frequency to the phase detector that matches the reference frequency received at the phase detector. The phase detector compares a phase of the reference frequency and the output frequency of the frequency divider and generates an error signal, proportional to a phase difference between the two frequencies. In some implementations, an analog multiplier or mixer can be used as a phase detector. Because the reference frequency and the output from the frequency divider are the same when the loop is locked, the output of the phase detector contains a direct current (DC) component and a signal at twice the frequency (this is true when the phase detector is in the form of a multiplier or mixer). The DC component is proportional to the phase difference. The double frequency component is removed by the low pass filter. Any phase difference then shows up as a control voltage (e.g., tuning voltage (Vtune)) to the VCO after filtering.

The mobile communication device may transmit data to, or receive data from, a communication network via a transmit path or receive path according to a current resource block (RB) allocation. The control unit may receive one or more indications (e.g., from the communication network or local device) of upcoming resource block allocations for the mobile communication device. Without a fast frequency hopping PLL, the control unit changes the frequency of the baseband modulated signal. On the other hand, the control unit may change the frequency of the LO path in accordance with fast frequency hopping. Accordingly, the control unit may program the PLL frequency divider to generate a new frequency at the local oscillator corresponding to a frequency of a new resource block (RB) allocation. The one or more indications may cause the PLL system to be subject to fast frequency hopping when a frequency allocated for resource blocks changes. While fast frequency hopping specifications are not related to the speed (how fast) of the RB allocation change, they are related to how much perturbation is allowed on the transmit output. For example, slow PLL settling causes error vector magnitude (EVM)/throughput degradation and transmit (TX) spurious emissions. The local oscillator frequency corresponding to a current resource block allocation may change to a new center frequency (e.g., of a resource block) based on a new frequency allocation for an expected resource block. As a result, the phase detector receives different frequencies very fast.

To accommodate the fast changing frequency, two-point modulation of the PLL is implemented to improve settling time of the PLL during the frequency hop. A two-point modulation implementation of the PLL includes tapping an input port of the VCO and an input port of the frequency divider and applying a frequency (e.g., frequency step) at the two input ports. For example, the VCO receives two inputs, an input voltage from the loop filter and a frequency step. The frequency step may be programmed from a modem to a wireless transmitter/receiver. For example, the modem writes information on the desired delta-frequency (change in frequency) with respect to the center frequency of a transmitter/receiver band into PLL registers. The frequency step applied to the VCO is scaled inside the control unit to correct for gain mismatches. The frequency divider receives an output of the VCO, which is based on the frequency step injected at an input of the VCO as well as an injection of the frequency step at an input port of the frequency divider.

The frequency step may be determined based on a new reference frequency associated with the fast frequency hopping. The reference frequency is derived from the crystal oscillator and is constant over time. That is, the crystal oscillator is the reference frequency of the PLL, which does not change during frequency hopping. In one instance, the step frequency injected at the VCO may have a different phase or gain than the step frequency injected at the frequency divider to accommodate discrepancies due to analog impairments especially associated with the high pass path. To compensate for a gain mismatch at the VCO, the frequency step injected at the input port of the VCO is multiplied by a gain factor, g.

When there are no gain/phase mismatches at the frequency divider output, the step signal applied through the modulus control of the frequency divider and the step signal applied through the second port of the VCO cancel each other out. Because the two injected signals are cancelled out before reaching the phase detector, the phase difference between the PLL reference, crystal oscillator, and the divider output after hopping remains essentially zero (unperturbed), and the PLL loop does not experience perturbations due to the frequency hop. In other words, the tuning voltage, Vtune, from the loop filter to the VCO is a constant during the frequency hop. Therefore, the PLL does not see the perturbations caused by the jump. Because the tuning voltage does not adapt to the new VCO frequency, the PLL bandwidth does not interfere with the settling time. Therefore, the two point injection method is not subject to integral phase noise (IPN) degradation and may achieve fast settling time even if the loop filter bandwidth is narrow. The two point injection method may also cover frequency jumps with a smaller VCO gain, while other conventional implementations specify large VCO gain (e.g., voltage gain (kvco) is 160 MHz/V) to cover frequency jumps.

According to aspects of the disclosure, when a gain and delay of the two paths (low pass path through the frequency divider of the PLL to the PLL output and high pass path through the VCO of the PLL to the PLL output) are matched, the PLL can hop to a new frequency without any transient or phase error. To accommodate analog impairments during the two-point modulation, a closed loop calibration circuit may be introduced to calibrate at least some performance parameters of the PLL. For example, closed loop calibrations may be performed to reduce gain and delay errors. Some analog impairments may be due to the differences in gain at the VCO and at the frequency divider. For example, the gain at the frequency divider may be digital and deterministic because of the digital characteristics at the frequency divider. The gain at the VCO, however, is analog because of the analog characteristics of the VCO. Accordingly, the gain at the VCO may be affected by temperature, voltage, process, etc.

A gain calibrator and delay calibrator may be coupled to the PLL to provide a gain calibration signal to the VCO and a delay calibration signal to the frequency divider. For example, the gain calibrator receives an error signal from a phase to digital converter (PDC). The error signal may be based on a difference in phase between the reference signal and the output signal from the frequency divider. A gain correlator at the gain calibrator correlates the error signal with a gain calibration signal and determines a gain associated with the correlation. The determined gain or a product of the determined gain and the gain calibration signal are provided to the VCO to calibrate the gain of the VCO. The delay calibrator receives the error signal from the phase to digital converter (PDC). A delay correlator at the delay calibrator correlates the error signal with a delay calibration signal and determines a delay coefficient. The delay coefficient and the delay calibration signal are provided to a filter (e.g., finite impulse response filter) in the delay calibrator. A filtered delay calibration signal is then provided to the frequency divider to calibrate the frequency divider. The filtered delay calibration signal may be provided to the frequency divider via a delta sigma modulator.

For explanatory purposes, some aspects of the disclosure are described with reference to the transmit chain or transmitter of a communication device (e.g., a user equipment (UE)). However, the aspects of the disclosure are equally applicable to a receive chain or receiver of the communication device.

FIG. 1 is a system diagram illustrating a network environment 100 according to various aspects. A communication network 120 may include one or more evolved universal mobile telecommunications system (UMTS) terrestrial radio access (E-UTRA) Node Bs (eNodeBs) including, for example, but not limited to, a first eNodeB 122 and a second eNodeB 124. The communication network 120 may be, for example, but not limited to, a wireless or mobile communication network.

The communication network 120 may be an LTE communication network. However, a person having ordinary skill in the art can appreciate that the communication network 120 may support different and/or additional radio access technologies (RATs), including, for example, but not limited to, wideband code division multiple access (WCDMA), global system for mobile communications (GSM), and time division-synchronous code division multiple access (TD-SCDMA) without departing from the scope of the present disclosure.

A mobile communication device 110 may communicate with the communication network 120 on a subscription 115 via the first eNodeB 122. For example, the mobile communication device 110 may transmit data to and receive data from the communication network 120 via the first eNodeB 122. A person having ordinary skill in the art can appreciate that the mobile communication device 110 may communicate with the communication network 120 on the subscription 115 via a different eNodeB (e.g., the second eNodeB 124) without departing from the scope of the present disclosure. Moreover, a person having ordinary skill in the art can appreciate that the mobile communication device 110 may communicate with different and/or additional communication networks on the subscription 115 and/or a different subscription without departing from the scope of the present disclosure.

Figure 2:
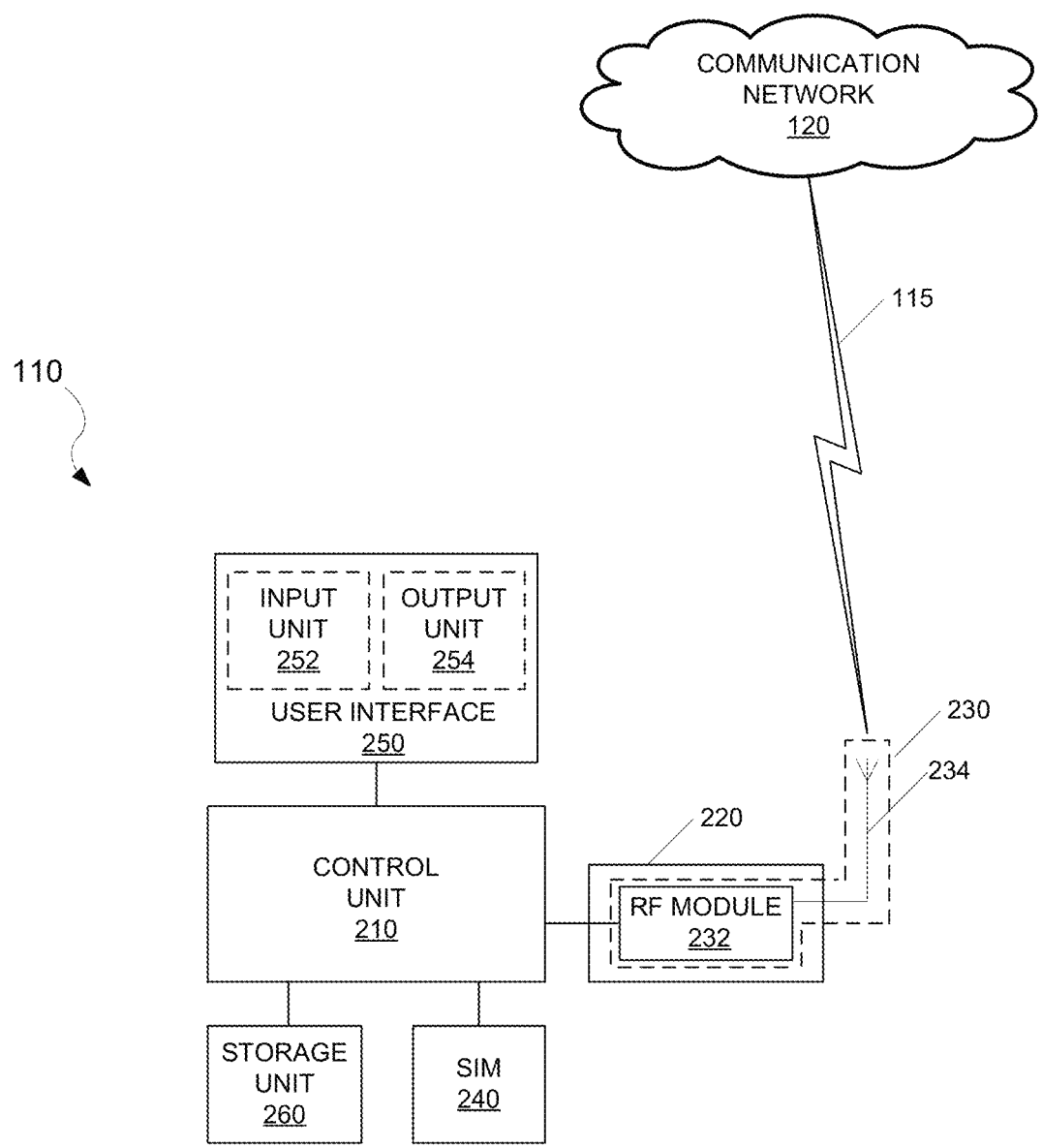
FIG. 2 is a block diagram illustrating a mobile communication device according to various aspects of the present disclosure.

FIG. 2 is a block diagram illustrating a mobile communication device 110 according to various aspects. Referring to FIGS. 1 and 2, the mobile communication device 110 may include a control unit 210, a communication unit 220, a subscriber identity module (SIM) 240, a user interface 250, and a storage unit 260.

The mobile communication device 110 may be any device capable of wirelessly communicating with one or more communication networks including, for example, but not limited to, the communication network 120. The mobile communication device 110 may be, for example, but not limited to, a smartphone, a tablet PC, or a laptop computer.

The SIM 240 may associate the communication unit 220 with the subscription 115 on the communication network 120. Although the mobile communication device 110 is shown to include a single SIM (e.g., the SIM 240), a person having ordinary skill in the art can appreciate that the mobile communication device 110 may include additional SIMs without departing from the scope of the present disclosure. The additional SIMs may associate the communication unit 220 with a different subscription on the communication network 120 or a different communication network.

The SIM 240 may be a universal integrated circuit card (UICC) that is configured with SIM and/or universal SIM (USIM) applications, enabling access to GSM and/or UMTS networks. The UICC may also provide storage for a phone book and other applications. Alternatively, in a CDMA network, a SIM may be a UICC removable user identity module (R-UIM) or a CDMA subscriber identity module (CSIM) on a card. A SIM card may have a central processing unit (CPU), read-only memory (ROM), random-access memory (RAM), electrically erasable programmable read-only memory (EEPROM) and input/output (I/O) circuits. An integrated circuit card identity (ICCID) SIM serial number may be printed on the SIM card for identification. However, a SIM may be implemented within a portion of memory of the mobile communication device 110, and thus need not be a separate or removable circuit, chip, or card.

The communication unit 220 may include an RF chain 230. The RF chain 230 may include, for example, but not limited to, an RF module or device 232 and an antenna 234. Although the mobile communication device 110 is shown to include a single communication unit (e.g., the communication unit 220), a person having ordinary skill in the art can appreciate that the mobile communication device 110 may include additional communication units without departing from the scope of the present disclosure.

The user interface 250 may include an input unit 252. The input unit 252 may be, for example, but not limited to, a keyboard or a touch panel. The user interface 250 may further include an output unit 254. The output unit 254 may be, for example, but not limited to, a liquid crystal display (LCD) or a light emitting diode (LED) display. A person having ordinary skill in the art will appreciate that other types or forms of input and output units may be used without departing from the scope of the present disclosure.

The control unit 210 may be configured to control the overall operation of the mobile communication device 110 including controlling the functions of the communication unit 220 including, for example, but not limited to, frequency synthesis performed by the RF module 232. The control unit 210 may be, for example, but not limited to, a microprocessor (e.g., general-purpose processor, baseband modem processor, etc.) or a microcontroller.

The storage unit 260 may be configured to store application programs, application data, and user data. At least some of the application programs stored at the storage unit 260 may be executed by the control unit 210 for the operation of the mobile communication device 110.

Figure 3:
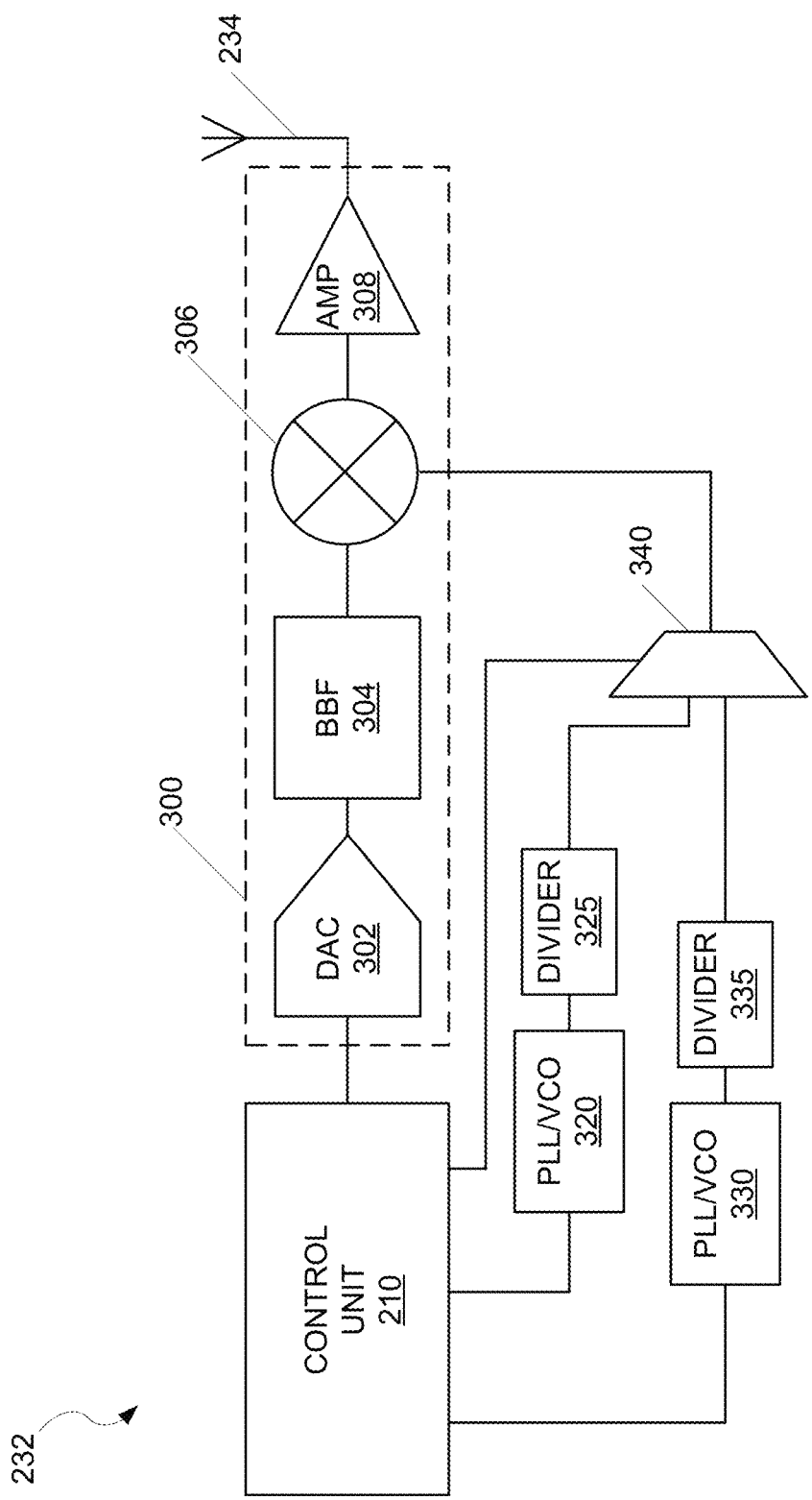
FIG. 3 is a block diagram illustrating a radio frequency (RF) module according to some aspects of the present disclosure.

FIG. 3 is a block diagram illustrating the RF module or device 232 according to some aspects. Referring to FIGS. 1, 2, and 3, the RF module 232 may include a transmit path 300 and a PLL selector 340.

The RF module 232 may further include multiple local oscillators (LO). The oscillators may comprise multiple phase lock loops (PLLs) with corresponding voltage controlled oscillators (VCOs) (PLL/VCOs) including, for example, but not limited to, a first PLL/VCO 320 and a second PLL/VCO 330. According to one exemplary aspect, the RF module 232 may include two PLL/VCOs (e.g., the first PLL/VCO 320 and the second PLL/VCO 330).

The first PLL/VCO 320 may be coupled with a first divider 325. The first PLL/VCO 320 may receive a reference signal having a reference frequency $F_{ref}$ from the control unit 210 and output a signal to the first divider 325. The combination of the first PLL/VCO 320 and the first divider 325 may be configured to generate and output a frequency divided signal that is synchronized to the phase and the frequency (e.g., $F_{ref}$) of the reference signal.

The second PLL/VCO 330 may be coupled with a second divider 335. The second PLL/VCO 330 may receive a reference signal having a reference frequency $F_{ref}$ from the control unit 210 and output a signal to the second divider 335. The combination of the second PLL/VCO 330 and the second divider 335 may be configured to generate and output a signal that is synchronized to the phase and the frequency (e.g., $F_{ref}$) of the reference signal.

In one implementation, an output signal from a PLL/VCO may be an undivided output signal, thus allowing for the omission of dividers.

The mobile communication device 110 may transmit data to the communication network 120 via the transmit path 300 according to a current RB allocation. The control unit 210 may receive from the communication network 120 an upcoming RB allocation for the mobile communication device 110. For example, the control unit 210 may be notified of the upcoming RB allocation on the physical downlink control channel (PDCCH) in advance (e.g., 4-8 slot periods).

The upcoming RB allocation may be different from a current RB allocation. For example, the upcoming RB allocation may have a different bandwidth and/or frequency range than the current RB allocation. A single RB may have a bandwidth of about 180 kHz, but other bandwidths may be used.

In one aspect, in order for the mobile communication device 110 to transmit data according to the upcoming RB allocation, the control unit 210 may select one of the first PLL/VCO 320 and the second PLL/VCO 330 that is not currently in use. The control unit 210 may tune the selected one of the first PLL/VCO 320 and the second PLL/VCO 330 to a target frequency based on a bandwidth of the upcoming RB allocation (e.g., number of allocated RBs).

For example, if the bandwidth of the upcoming RB allocation is narrow (e.g., number of allocated RBs less than or equal to a threshold x, where x may be equal to 6 or another integer value), the control unit 210 may tune the selected one of the first PLL/VCO 320 and the second PLL/VCO 330 to a frequency corresponding to the allocated RBs (e.g., center frequency of the allocated RBs).

In one exemplary aspect, the control unit 210 may determine the frequency corresponding to the upcoming RB allocation based on a lookup table (LUT). For example, the control unit 210 may determine, based on the LUT, the target frequency to tune the selected one of the first PLL/VCO 320 and the second PLL/VCO 330 in order for the mobile communication device 110 to transmit data in accordance with the upcoming RB allocation. In various aspects, the LUT may provide correlations between one or more RB allocations (e.g., in each frequency band) and target frequencies to tune each of the PLL/VCOs including, for example, but not limited to, the first PLL/VCO 320 and/or the second PLL/VCO 330.

Alternately, if the bandwidth of the upcoming RB allocation is not narrow (e.g., number of allocated RBs greater than x, where x may be equal to 6 or another integer value), the control unit 210 may tune the selected one of the first PLL/VCO 320 and the second PLL/VCO 330 to a frequency corresponding to an assigned channel (e.g., center frequency of assigned E-UTRA absolute radio frequency channel number (EARFCN)).

The control unit 210 may perform coarse tuning (CT) calibration on the selected one of the first PLL/VCO 320 and the second PLL/VCO 330 in order to achieve the target frequency (e.g., frequency corresponding to allocated RBs or to assigned EARFCN). In some aspects, the control unit 210 may perform CT calibration on the selected one of the first PLL/VCO 320 and the second PLL/VCO 330, and allow the selected one of the first PLL/VCO 320 and the second PLL/VCO 330 to settle to the target frequency. Alternately, in some aspects, the control unit 210 may perform CT calibration on the selected one of the first PLL/VCO 320 and the second PLL/VCO 330, and perform two-point modulation (TPM) to achieve the target frequency.

The PLL selector 340 may be configured to receive one or more control signals from the control unit 210. According to one exemplary aspect, the PLL selector 340 may select a frequency divided signal generated by the first PLL/VCO 320 and the first divider 325 or by the second PLL/VCO 330 and by the second divider 335 to output to the transmit path 300 based on the one or more control signals from the control unit 210. The control unit 210 may be configured to cause the PLL selector 340 to perform the switch while a first symbol (e.g., symbol #0) is transmitted by the mobile communication device 110 according to the upcoming RB allocation. Additionally, the switch may be performed during a transmission of a cyclic prefix (CP) of a symbol (e.g., symbol #0).

The transmit path 300 may include a digital to analog converter (DAC) 302 configured to receive a digital signal from the control unit 210 and to convert the digital signal into an analog signal. The transmit path 300 may further include a baseband filter (BBF) 304. The BBF 304 may be configured to receive the analog signal from the DAC 302. The BBF 304 may be further configured to receive one or more control signals from the control unit 210. Based on the one or more control signals from the control unit 210, the BBF 304 may be configured to modify a bandwidth of the analog signal received from the DAC 302 to produce a baseband signal (e.g., a filtered analog signal).

The transmit path 300 may include a mixer 306. The mixer 306 may be configured to modulate the frequency divided signal from the PLL selector 340 with the baseband signal from the BBF 304 to generate an up-converted signal. In some aspects, when the bandwidth of RB allocation is narrow (e.g., number of allocated RBs less or equal to x), the frequency divided signal from the PLL selector 340 may be at a frequency corresponding to the upcoming RB allocation (e.g., center frequency of upcoming RB allocation). Alternately, when the bandwidth of the RB allocation is not narrow (e.g., number of allocated RBs greater than x), the frequency divided signal from the PLL selector 340 may correspond to the assigned channel (e.g., center frequency of assigned EARFCN). The up-converted signal may have a frequency corresponding to the upcoming RB allocation (e.g., center frequency of upcoming RB allocation).

In various aspects, the BBF 304 may be configured to produce a baseband signal based on a specified frequency of the RB allocation and a tuned frequency of the frequency divided signal received at the transmit path 300 (e.g., from the PLL selector 340). For example, the frequency of the baseband signal generated by the BBF 304 may be adjusted such that modulating the baseband signal with the frequency divided signal generates an up-converted signal at the specified frequency of the upcoming RB allocation (e.g., center frequency of upcoming RB allocation).

The transmit path 300 may further include an amplifier (amp) 308. The amp 308 may be configured to amplify the up-converted signal from the mixer 306 for transmission.

The antenna 234 may receive the amplified signal from the amp 308 and transmit the amplified signal. For example, an amplified signal from the amp 308 may be transmitted to the communication network 120 (e.g., the first eNodeB 122 or the second eNodeB 124) on the subscription 115 via the antenna 234.

A person having ordinary skill in the art can appreciate that the RF module 232 may include additional and/or different components than shown in FIG. 3 without departing from the scope of the present disclosure. For example, although not shown, a person having ordinary skill in the art can appreciate that the RF module 232 may additionally include a receive path without departing from the scope of the present disclosure.

Figure 4:
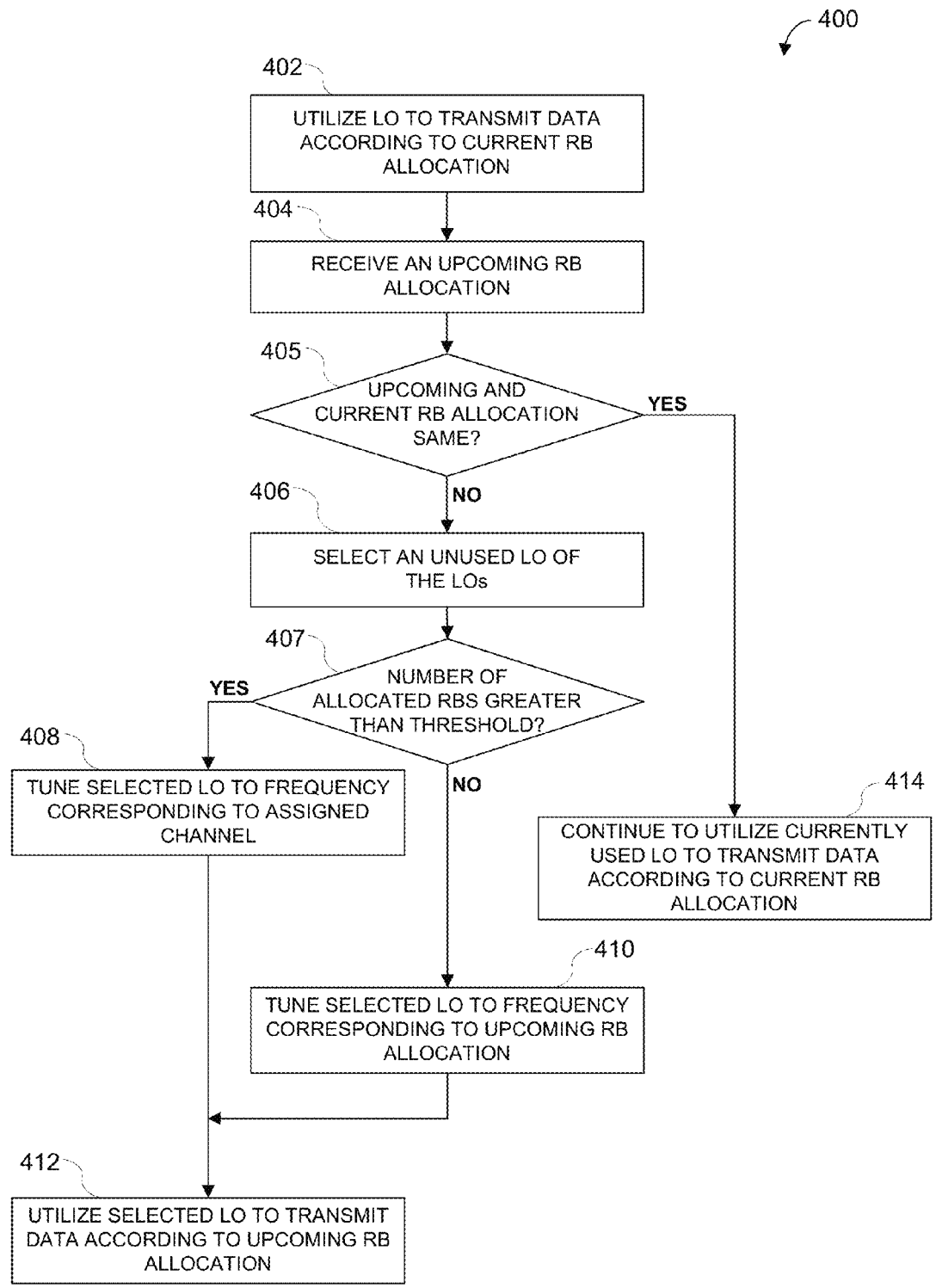
FIG. 4 is a flowchart illustrating a process for frequency hopping according to various aspects of the present disclosure.

FIG. 4 is a flowchart illustrating a process 400 for frequency hopping according to various aspects. Referring to FIGS. 2 and 3, the process 400 may be performed by the control unit 210.

The control unit 210 may utilize one of the LOs to transmit data according to a current RB allocation (block 402). For example, the control unit 210 may have tuned the first PLL/VCO 320 to generate a signal at a frequency corresponding to the current RB allocation. As such, the first PLL/VCO 320 may be generating a voltage controlled signal at a frequency corresponding to the current RB allocation (e.g., center frequency of current RB allocation) or at a frequency corresponding to the assigned channel (e.g., center frequency of assigned EARFCN). According to one exemplary aspect, the control unit 210 may also have transmitted one or more control signals to the PLL selector 340 causing the PLL selector 340 to switch to the voltage controlled signal output by the first PLL/VCO 320 and not another of the PLL/VCOs (e.g., the second PLL/VCO 330).

The control unit 210 may receive an upcoming RB allocation (block 404). For example, the control unit 210 may receive an upcoming RB allocation for the mobile communication device 110 from the communication network 120 (e.g., via the first eNodeB 122 or the second eNodeB 124) on the PDCCH in advance (e.g., 4-8 slot periods).

The control unit 210 may determine whether the upcoming RB allocation is the same as the current RB allocation (block 405). For example, the control unit 210 may compare the current and upcoming RB allocation to determine whether a bandwidth and/or frequency range of the upcoming RB allocation is different from a bandwidth and/or frequency range of the current RB allocation.

If the control unit 210 determines that the upcoming RB allocation is the same as the current RB allocation (405-YES), the control unit 210 may continue to utilize the currently used LO to transmit data according to the current RB allocation (block 414). For example, if the bandwidth and/or frequency range of the upcoming RB allocation is the same as the bandwidth and/or frequency range of the current RB allocation, the control unit 210 may continue to utilize the first PLL/VCO 320 to generate a voltage controlled signal at a frequency corresponding to the current RB allocation or at a frequency corresponding to the assigned channel (e.g., center frequency of assigned channel).

If the control unit 210 determines that the upcoming RB allocation is not the same (e.g., different) as the current RB allocation (405-NO), the control unit 210 may select an unused LO of the LOs (block 406). For example, if the control unit 210 determines that the upcoming RB allocation has a different bandwidth and/or frequency range than the current RB allocation, the control unit 210 may select the second PLL/VCO 330, which is not currently being used to transmit data according to the current RB allocation.

The control unit 210 may determine whether a number of allocated RBs associated with the upcoming RB allocation is greater than a threshold (block 407). For example, the control unit 210 may determine whether a bandwidth of the upcoming RB allocation is narrow (e.g., upcoming number of allocated RBs equal to or less than the threshold) or not narrow (e.g., upcoming number of allocated RBs greater than the threshold).

If the control unit 210 determines that the number of allocated RBs associated with the upcoming RB allocation is greater than the threshold (407-YES), the control unit 210 may tune the selected LO to a frequency corresponding to an assigned channel (block 408). For example, if the control unit 210 determines that the upcoming RB allocation is not narrow (e.g., upcoming number of allocated RBs greater than the threshold), the control unit 210 may tune the second PLL/VCO 330 to a center frequency of the assigned channel.

In some aspects, tuning the selected LO (e.g., the second PLL/VCO 330) may include performing CT calibration and allowing the selected LO (e.g., the second PLL/VCO 330) to settle to the frequency corresponding to the assigned channel. In other aspects, the control unit 210 may tune the selected LO (e.g., the second PLL/VCO 330) by performing CT calibration and TPM.

Alternately, the control unit 210 may determine that the upcoming number of allocated RBs is not greater than the threshold (407-NO). As such, the control unit 210 may tune the selected LO to a frequency corresponding to the upcoming RB allocation (block 410). For example, if the control unit 210 determines that the upcoming RB allocation is narrow (e.g., upcoming number of allocated RBs less than or equal to the threshold), the control unit 210 may tune the selected LO to a center frequency of the upcoming RB allocation.

In one exemplary aspect, the control unit 210 may determine the frequency corresponding to the upcoming RB allocation based on a look up table (LUT.) For example, the control unit 210 may determine, based on the LUT, a target frequency to which to tune the selected LO in order for the mobile communication device 110 to transmit data in accordance with the upcoming RB allocation. In various aspects, the look up table may provide correlations between one or more RB allocations (e.g., in each frequency band) and frequencies to which to tune each of the PLL/VCOs including, for example, but not limited to, the first PLL/VCO 320 and the second PLL/VCO 330.

In some aspects, tuning the selected LO (e.g., the second PLL/VCO 330) may include performing CT calibration and allowing the selected LO (e.g., the second PLL/VCO 330) to settle to the frequency corresponding to the assigned channel. In other aspects, the control unit 210 may tune the selected LO (e.g., the second PLL/VCO 330) by performing CT calibration and two point modulation (TPM.)

The control unit 210 may utilize the selected LO to transmit data according to the upcoming RB allocation (block 412). For example, in one aspect, the first PLL/VCO 320 and the second PLL/VCO 330 may each be coupled with a corresponding divider (e.g., the first divider 325 and the second divider 335). As such, the control unit 210 may transmit one or more signals to the PLL selector 340 that cause the PLL selector 340 to switch from the frequency divided signal output by the first divider 325 to the frequency divided signal output by the second divider 335.

Alternately, in other aspects, the first PLL/VCO 320 and the second PLL/VCO 330 may share a single divider (e.g., the third divider). As such, the control unit 210 may transmit one or more control signals to the PLL selector 340 causing the PLL selector 340 to switch from the voltage controlled signal output by the first PLL/VCO 320 to the voltage controlled signal output by the second PLL/VCO 330.

According to one exemplary aspect, the control unit 210 may cause the PLL selector 340 to perform the switch while a first symbol (e.g., symbol #0) is transmitted by the mobile communication device 110 according to the upcoming RB allocation. The switch may be further performed during a transmission of the CP of a symbol (e.g., symbol #0).

Figure 5:
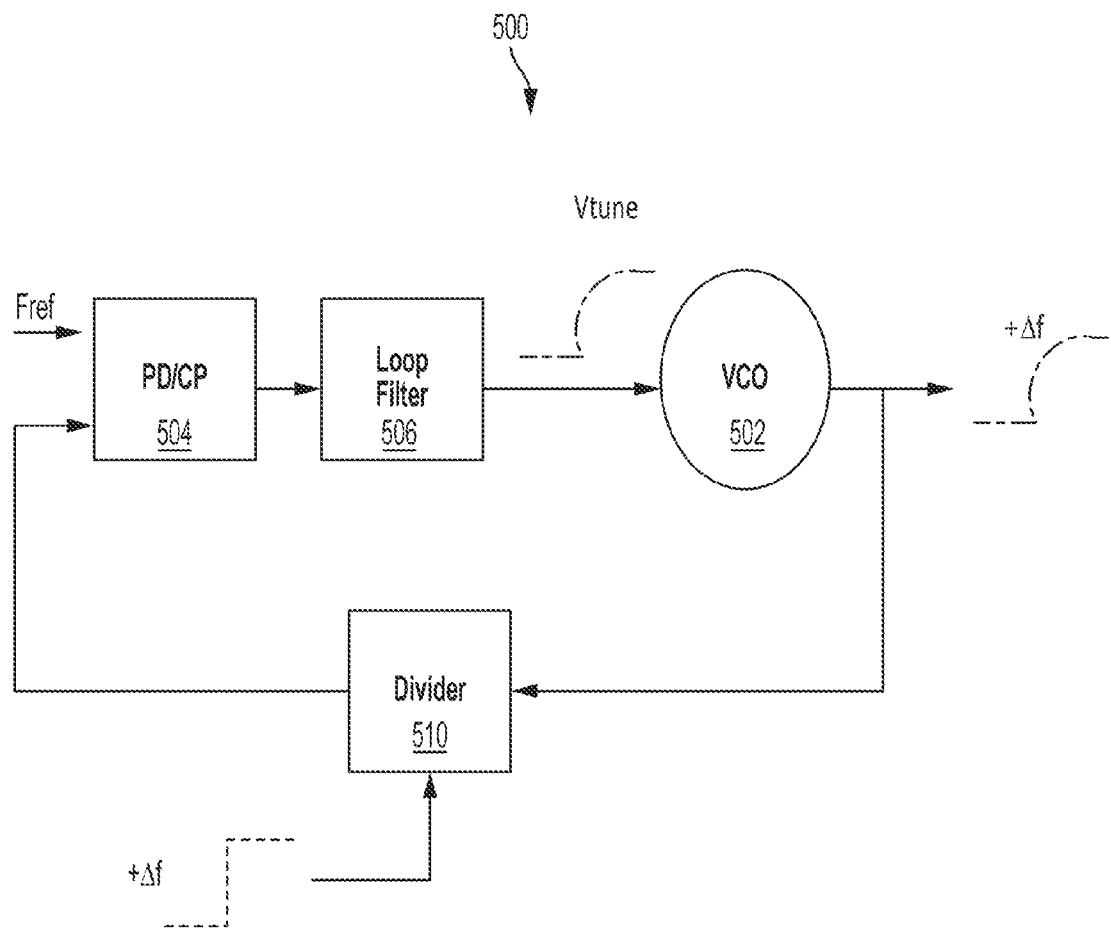
FIG. 5 illustrates a phase lock loop (PLL) system according to aspects of the present disclosure.

FIG. 5 illustrates a phase lock loop (PLL) system 500. The PLL system 500 includes a voltage controlled oscillator (VCO) 502, a phase detector 504, a loop filter (e.g., low pass filter) 506, and a frequency divider (e.g., integer-N synthesizer or fractional synthesizer) 510. The PLL system 500 may be integrated in a mobile communication device. For example, the PLL system 500 may be implemented in a radio frequency (RF) module of the mobile communication device.

The phase detector 504 may be coupled to the loop filter 506, the loop filter 506 may be coupled to the VCO 502, the VCO 502 may be coupled to the frequency divider 510 and the frequency divider 510 may be coupled to the phase detector 504 to close a feedback loop. The output of the VCO 502 may be a frequency sinusoid that is controlled by a tuning voltage Vtune, which is received by the VCO 502 from the loop filter 506. For example, changing the tuning voltage Vtune changes the frequency of the VCO 502. To synthesize a desirable or exact frequency of the VCO 502, the output frequency of the VCO 502 is fed back to the frequency divider 510. The phase detector 504 compares an output of the frequency divider 510 with a reference signal (e.g., reference signal Fref). In some aspects, the reference frequency may be generated by a stable local crystal oscillator (not shown).

For example, if the reference frequency of the crystal oscillator is at 40 MHz and the output of the VCO 502 is at 4 GHz, the frequency divider 510 receives the 4 GHz output of the VCO 502. The frequency divider 510 is programmed to divide by 100 to provide an output frequency to the phase detector 504 that matches the reference frequency received at the phase detector 504. The phase detector 504 compares a phase of the reference frequency and the output frequency of the frequency divider 510 and generates an error signal, proportional to a phase difference between the two frequencies. In some implementations, an analog multiplier or mixer can be used as the phase detector 504. Because the reference frequency and the output from the frequency divider are the same when the loop is locked, the output of the phase detector 504 contains a direct current (DC) component and a signal at twice the frequency (e.g., this is true when the phase detector is in the form of a multiplier or mixer). The DC component is proportional to the phase difference. The double frequency component is removed by the loop filter 506. Any phase difference then shows up as a control voltage (e.g., tuning voltage (Vtune)) to the VCO 502 after filtering.

To achieve fast frequency hopping in the PLL system 500, it is desirable to achieve a PLL lock to a new frequency over a very short period of time. One method to achieve fast frequency hopping is based on a single point modulation. To achieve the frequency hop or jump, the control of the frequency divider 510 may be adjusted. For example, a modulus control of the frequency divider 510 may be adjusted to achieve the frequency jump. The control signal at the input of the frequency divider 510 may be adjusted to inject a frequency jump/hop+Δf at the frequency divider 510 to substantially match a frequency hop of +Δf at the output of the VCO 502. Thus, the PLL reacts as a result of the change in frequency at the frequency divider to accommodate the new frequency. However, the settling time in the single point modulation will be linked to the bandwidth of the PLL. The bandwidth of the PLL for the single point modulation may have to be adjusted to improve settling time. For example, the wide bandwidth may be used during the PLL lock to achieve a faster settling time. Accordingly, it is desirable to achieve fast frequency hopping while reducing settling time without dynamically adjusting PLL bandwidth or while remaining independent of the PLL bandwidth.

Figure 6:
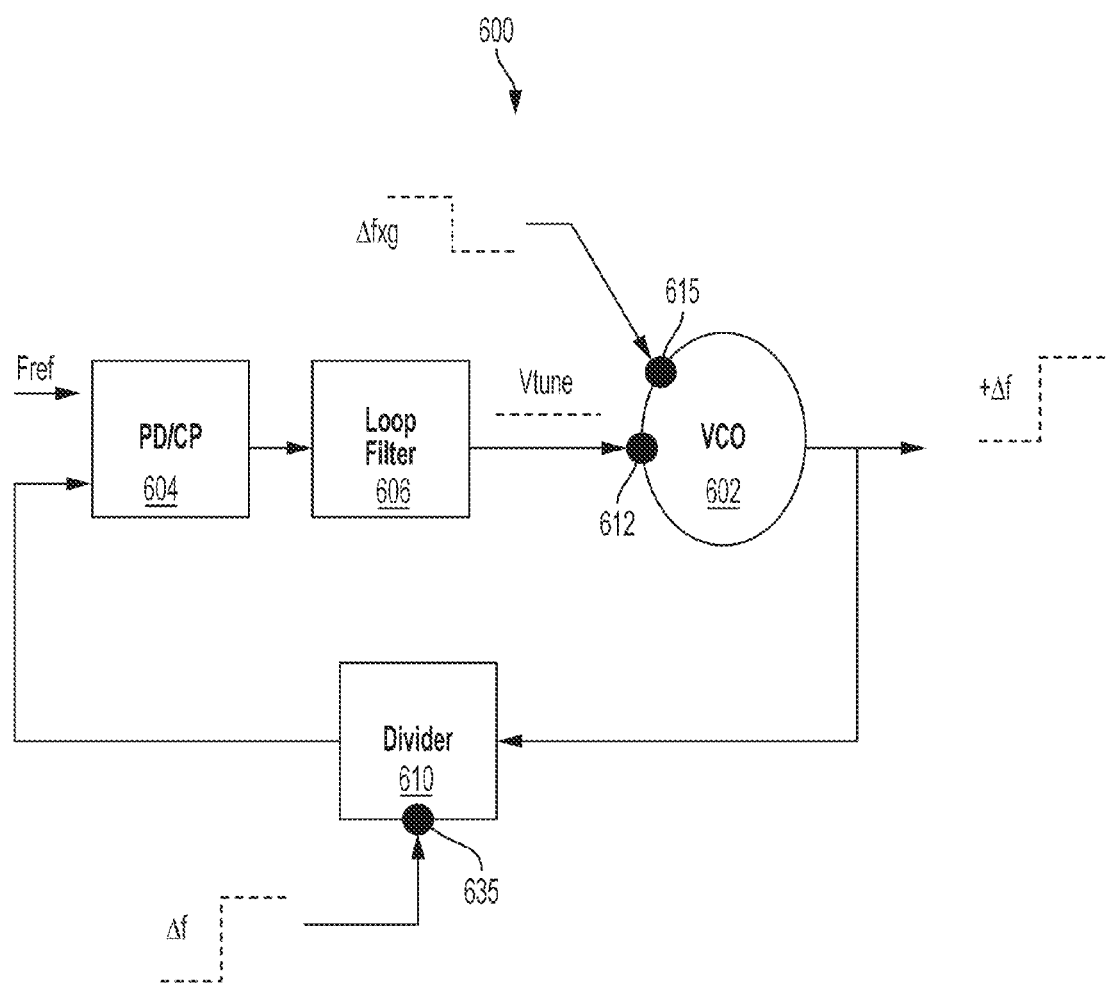
FIG. 6 illustrates a phase lock loop (PLL) system that achieves fast frequency hopping according to aspects of the present disclosure.

FIG. 6 illustrates another phase lock loop (PLL) system 600 that achieves fast frequency hopping according to aspects of the present disclosure. To accommodate the fast changing frequency, two-point modulation of the PLL is implemented to improve settling time of the PLL during the frequency hop. A two-point modulation implementation of the PLL includes tapping an input port 615 of a VCO 602 and an input port 635 of a frequency divider 610 and applying a frequency (e.g., frequency step) at the two input ports 615 and 635. For example, the VCO 602 receives two inputs, an input voltage from a loop filter 606 at an input port 612 and a frequency step at the input port 615. The frequency step may be programmed from a modem (not shown) to a wireless transmitter/receiver. For example, the modem writes information on the desired delta-frequency (change in frequency Δf) with respect to the center frequency of a transmitter/receiver band into PLL registers.

The frequency step applied to the VCO 602 is scaled inside the control unit to correct for gain mismatches. For example, the change in frequency (e.g., frequency step) applied to the VCO 602 by the control unit (e.g., control unit 210) may be given by Δf*g, where g is a gain factor. The gain factor g is introduced to compensate for the gain at the VCO 602. The frequency divider 610 receives an output of the VCO 602, which is based on the frequency step injected at the input port 615 of the VCO 602 as well as an injection of the frequency step at the input port 635 of the frequency divider 610.

The frequency step may be determined based on a new reference frequency associated with the fast frequency hopping. As noted above, the crystal oscillator is the reference frequency of the PLL, which does not change during frequency hopping. In one instance, the step frequency injected at the VCO 602 may have a different phase or gain than the step frequency injected at the frequency divider 610 to accommodate discrepancies due to analog impairments especially associated with the high pass path. To compensate for a gain mismatch at the VCO 602, the frequency step injected at the input port 615 of the VCO 602 is multiplied by the gain factor, g, to achieve matching gains at the high pass path and the low pass path. The low pass path exhibits a low pass transfer function while the high pas path exhibits a high pass transfer function.

When there are no gain/phase mismatches at the frequency divider output, the step signal applied through the modulus control of the frequency divider 610 and the step signal applied through the input port 615 of VCO 602 cancel each other out. Because the two injected signals are cancelled out before reaching a phase detector 604, the phase difference between the PLL reference, crystal oscillator, and the frequency divider output after hopping remains essentially zero (unperturbed), and the PLL loop does not experience perturbations due to the frequency hop. In other words, the tuning voltage Vtune from the loop filter 606 to the VCO is a constant during the frequency hop. Therefore, the PLL does not see the perturbations caused by the jump. Because the tuning voltage does not adapt to the new VCO frequency, the PLL bandwidth does not interfere with the settling time. Thus, fast settling can be achieved with a narrow bandwidth.

At an input port 612 of the VCO 602, a tuning voltage is received from the loop filter 606 that controls the frequency at the output of the VCO 602. Additionally, at the input port 615, a digital signal (e.g., frequency step) is received from the control unit that controls the output frequency of the VCO 602. Although a single input port 615 is described, multiple input ports may be implemented to receive multiple frequency steps. Thus, a digital to frequency conversion occurs at the VCO 602. The digital to frequency conversion may be implemented by one or more digital to analog converters (DAC) in the VCO 602. For example, a digital output of the loop filter 606 may be a multi-bit (e.g., 10 bits) digital word filter that provides the VCO 602 with multiple digital input values. To accommodate the multiple digital input values, the VCO 602 may include multiple digital to analog converters (DACs). For example, one of the DACs may be used for coarse frequency adjustment and the other may be used for fine frequency adjustment. In some aspects of the disclosure, however, a single digital to analog converter (DAC) of the VCO 602 is used to cover all the frequency adjustments (e.g., including both coarse and fine frequency adjustments). Different types of digital to analog converters (DACs) may be implemented in the VCO to reduce gain error or mismatch, as shown in FIGS. 7 and 8.

Figure 7:
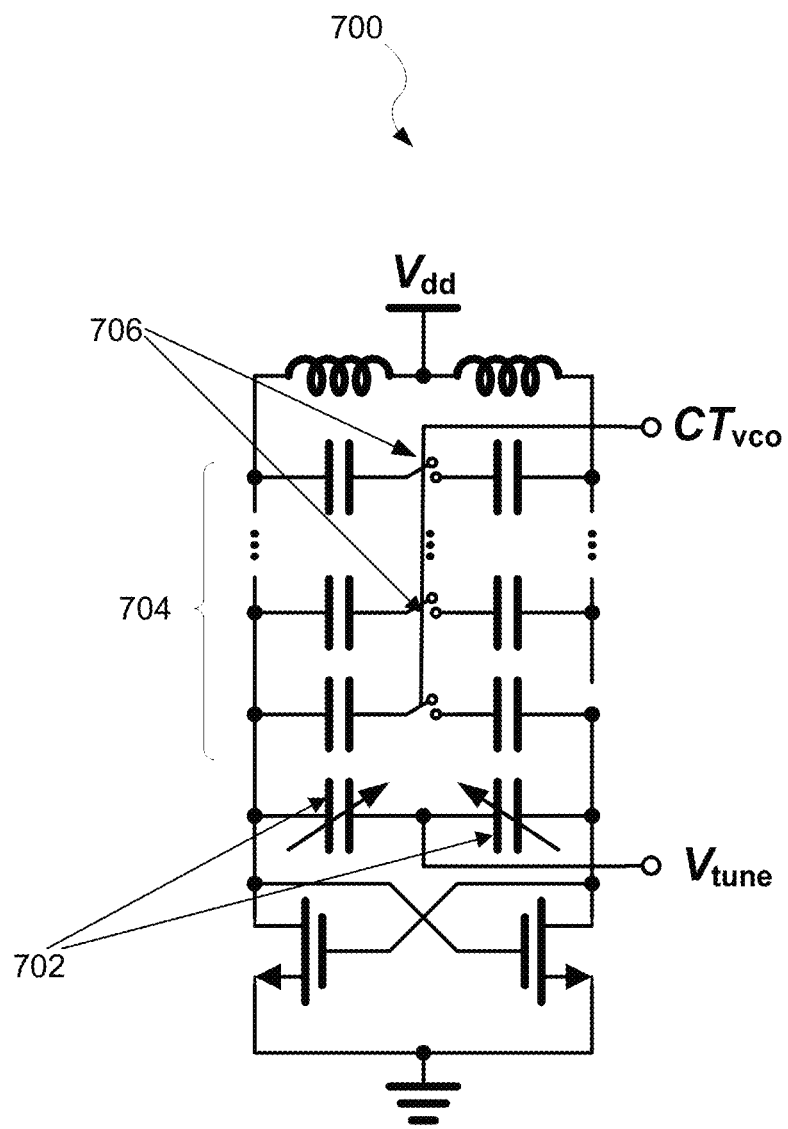
FIG. 7 illustrates a switched capacitor bank according to aspects of the present disclosure.

FIG. 7 illustrates a switched capacitor bank 700 according to aspects of the present disclosure. The output frequency of the VCO changes when a voltage applied to the switched capacitor bank 700 is varied. For example, the tuning voltage vtune may be applied to variable capacitance elements 702 in the switched capacitor bank 700. In some implementations, the tuning voltage vtune of the loop filter may be applied to variable capacitance elements 702 to achieve fine adjustment of frequency. Selection of a capacitor bank in a VCO group 704 is controlled by on/off control of switches 706 between capacitor elements by a capacitor bank switching signal $CT_{vco}$ to vary the capacitance of the VCO. The switching signal may be provided by a VCO automatic control block (not shown).

Figure 8:
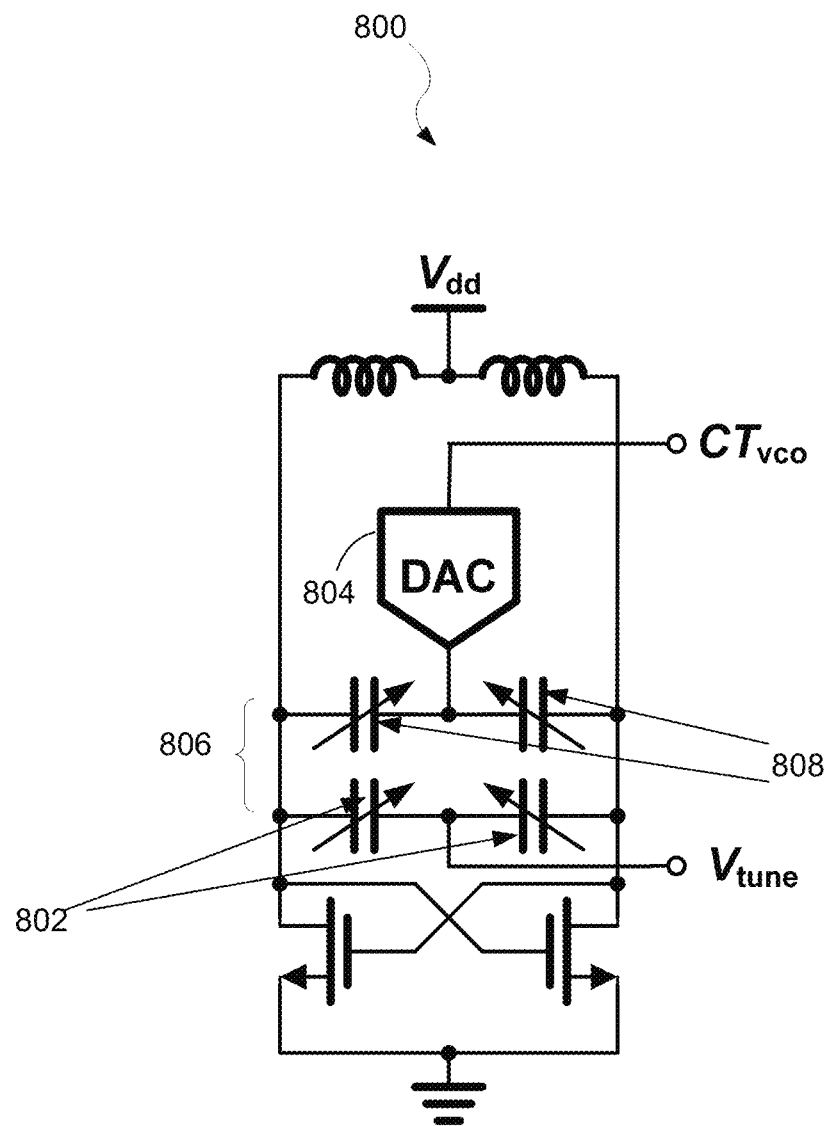
FIG. 8 illustrates a voltage digital to analog convertor (DAC) and varactor according to aspects of the present disclosure.

FIG. 8 illustrates a voltage digital to analog convertor (DAC) and varactor 800 according to aspects of the present disclosure. The voltage DAC and varactor 800 includes a DAC 804 merged with the varactor 806. The output frequency of the VCO changes when a voltage applied to the voltage DAC and varactor 800 is varied. For example, the tuning voltage vtune may be applied to variable capacitance elements 802 of the varactor 806. In some implementations, the tuning voltage vtune of the loop filter may be applied to variable capacitance elements 802 to achieve fine adjustment of frequency. The DAC 804 is coupled to variable capacitances 808 and is controlled by a control signal $CT_{vco}$ provided by a VCO automatic control block (not shown). The size of the capacitance of the varactor may be varied based on the tuning voltage vtune and/or the control signal $CT_{vco}$. In some implementations, the switched capacitor bank 700 may be used instead of the voltage DAC and varactor 800 to avoid impairments caused by the varactor 806. For example, the varactor may cause nonlinear voltage-to-frequency conversion, gain variation over temperature and penalty in flicker noise up-conversion. However, the switched capacitor may limit or reduce an achievable resolution. For example, gain error is ultimately limited by the VCO frequency resolution (assuming ideal gain matching) and not by local oscillator jump.

According to aspects of the disclosure, when a gain and delay of the two paths (low pass path through the frequency divider and high pass path corresponding to the frequency injection into the VCO 602) are matched, the PLL can hop to a new frequency without any transient or phase error. For example, when a gain and delay of the two paths are matched then the settling time is eliminated or reduced to substantially zero and the PLL can lock to a new frequency instantly. In this case, no error (e.g., phase error) is detected at the input of the phase detector 604 and the tuning voltage Vtune is constant. In some implementations, because of analog impairments the PLL may be subject to transient or phase error, as illustrated in FIGS. 9, 10 and 11.

FIG. 9 illustrates a phase lock loop (PLL) system 900 that achieves fast frequency hopping according to aspects of the present disclosure. The PLL system 900 includes a voltage controlled oscillator (VCO) 902, a phase detector/charge pump 904, a loop filter (e.g., low pass filter) 906, and a frequency divider (e.g., integer-N synthesizer or fractional synthesizer) 910. The PLL system 900 may be subject to gain and delay errors caused by analog impairments that impairs the injection of the step frequency. For example, the desired frequency step for two point (TP) injection to be injected into the VCO 902 is +Δf. However, due to the analog impairments, (which can cause a gain error) the step frequency is degraded. For example, the step frequency in this case may be given by a product of +Δf and an error function (1−ε), where ε is an error parameter (e.g., gain error), as shown in FIG. 10. The error parameter may be caused by analog impairments in the VCO 902.

FIG. 10 illustrates a timing diagram 1000 of a two point injection implementation according to aspects of the present disclosure. The timing diagram illustrates a step frequency versus time. The step frequency+Δf to be injected into an input port 915 of a VCO 902 of the PLL system 900 may not be attained due to analog impairments. For example, the actual step frequency attained is given by the product of +Δf and the error function (1−ε), which is less than the desirable step frequency+Δf. A transient or overshoot (os) associated with the actual step frequency response settles at the desirable step frequency+Δf. The gap between the desirable step frequency+Δf and the actual step frequency attained is provided by the tuning voltage of the PLL, as shown in FIG. 11. For example, the gap frequency is given by the product of +Δf and the error parameter (ε). Although, the PLL will recover to the desirable step frequency+Δf, the settling time (ts) is affected. For example the settling time (ts) is longer.

FIG. 11 illustrates yet another phase lock loop (PLL) system 1100 that achieves fast frequency hopping according to aspects of the present disclosure. The PLL system 1100 includes a voltage controlled oscillator (VCO) 1102, a phase detector/charge pump 1104, a loop filter (e.g., low pass filter) 1106, and a frequency divider (e.g., integer-N synthesizer or fractional synthesizer) 1110. A two point injection is implemented with a gain error (e.g., 1%) and a desirable jump of 40 MHz, which means the PLL should recover 400 kHz frequency (given by the product of +Δf and the error parameter (ε)). Thus, the PLL may be specified to jump by 400 kHz and the tuning voltage Vtune is adjusted to cover the gap of 400 kHz.

To accommodate analog impairments during the two-point modulation, a closed loop calibration may be introduced to calibrate at least some performance parameters of the PLL. For example, closed loop calibrations may be performed to reduce gain and delay errors. In some aspects of the disclosure, the closed loop calibrations may be performed in digital domain to reduce the gain and delay errors.

Figure 12:
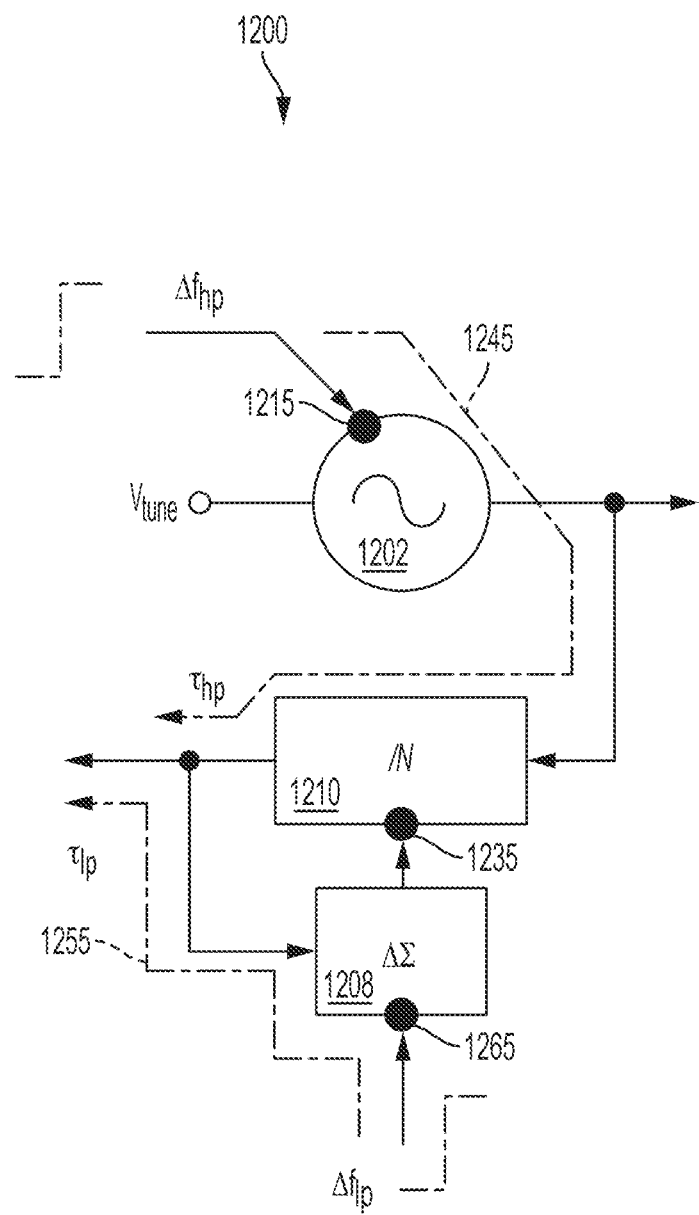
FIG. 12 is a phase lock loop system illustrating a delay mismatch between the high pass path and the low pass path according to aspects of the present disclosure.

FIG. 12 is a phase lock loop system 1200 illustrating a delay mismatch between a high pass path 1245 and a low pass path 1255. The phase lock loop system 1200 includes a VCO 1202 of a PLL coupled to a frequency divider 1210 of the PLL, and a delta sigma modulator 1208 coupled to the frequency divider 1210 of the PLL. The high pass path 1245 goes through the VCO 1202 and the frequency divider 1210 while the low pass path 1255 goes through the delta sigma modulator 1208 and the frequency divider 1210.

The two-point modulation implementation of the PLL includes tapping an input port 1215 of the VCO 1202 and an input port 1235 of the frequency divider 1210 and applying a frequency (e.g., first and second frequency steps, $\Delta f_{hp}$, $\Delta f_{lp}$) at the two input ports 1215 and 1235. In some implementations, the two-point modulation implementation of the PLL includes tapping an input port 1215 of the VCO 1202 and the input port 1235 of the frequency divider 1210 via an input port 1265 of the delta sigma modulator 1208 and applying a frequency (e.g., frequency step) at the two input ports 1215 and 1235 (via the input port 1265).

The frequency (e.g., first and second frequency steps, $\Delta f_{hp}$, $\Delta f_{lp}$) applied at the two input ports 1215 and 1265 may be subject to delay mismatch. For example, a delay mismatch may exist between the high pass path 1245 and the low pass path 1255. The delay mismatch between the high pass path 1245 and the low pass path 1255 may induce a phase error at the phase detector input or phase/frequency detector (PFD) input. For example, the delay mismatch induced phase error may be given by the following equation that provides a metric of the delay that can be tolerated:

$$\Delta_\tau < \varphi_\varepsilon/(2\pi\Delta f)$$

where
$\Delta_\tau$ is a difference between a time $\tau_{hp}$ of application of the first frequency step $\Delta f_{hp}$ and a time $\tau_{lp}$ of application of the second frequency step $\Delta f_{lp}$;
$\varphi_\varepsilon$ is a phase error; and
Δf is the frequency jump The phase error may be proportional to the frequency change or jump and the delay mismatch.

Figure 13:
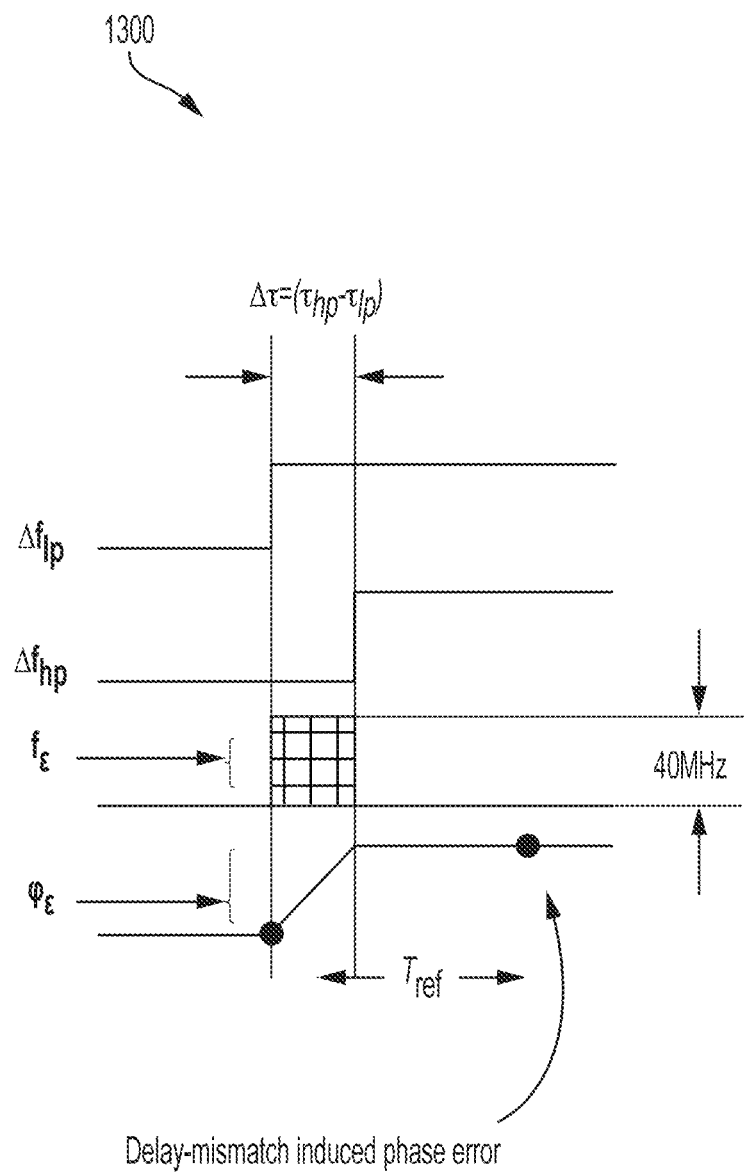
FIG. 13 is a timing diagram showing a frequency and a phase error caused by the delay mismatch when a first frequency step and a second frequency step are applied at two different input ports of a phase lock loop according to aspects of the present disclosure.

FIG. 13 is a timing diagram 1300 showing a frequency and a phase error caused by a delay mismatch when the first frequency step $\Delta f_{hp}$ and the second frequency step $\Delta f_{lp}$ are applied at the two input ports 1215 and 1265 according to aspects of the present disclosure. The timing diagram 1300 shows the first frequency step $\Delta f_{hp}$, the second frequency step $\Delta f_{lp}$, frequency error $f_\varepsilon$ and phase error $\varphi_\varepsilon$. In some instances, when the first frequency step $\Delta f_{hp}$ and second frequency step $\Delta f_{lp}$ are applied at the two input ports 1215 and 1265, there is a mismatch in time of application as illustrated by the difference $\Delta_\tau$ between a time $\tau_{hp}$ of application of the first frequency step $\Delta f_{hp}$ and a time $\tau_{lp}$ of application of the second frequency step $\Delta f_{lp}$. For a time equal to the delay mismatch, there is a frequency error $f_\varepsilon$ between the two paths, which creates a phase error $\varphi_\varepsilon$, which is an integral of the frequency error $f_\varepsilon$. For example, $\Delta_\tau$ may be equal to 350 pico seconds for a frequency jump of 40 MHz. A calibration implementation is introduced to mitigate the delay mismatch.

Figure 14A:
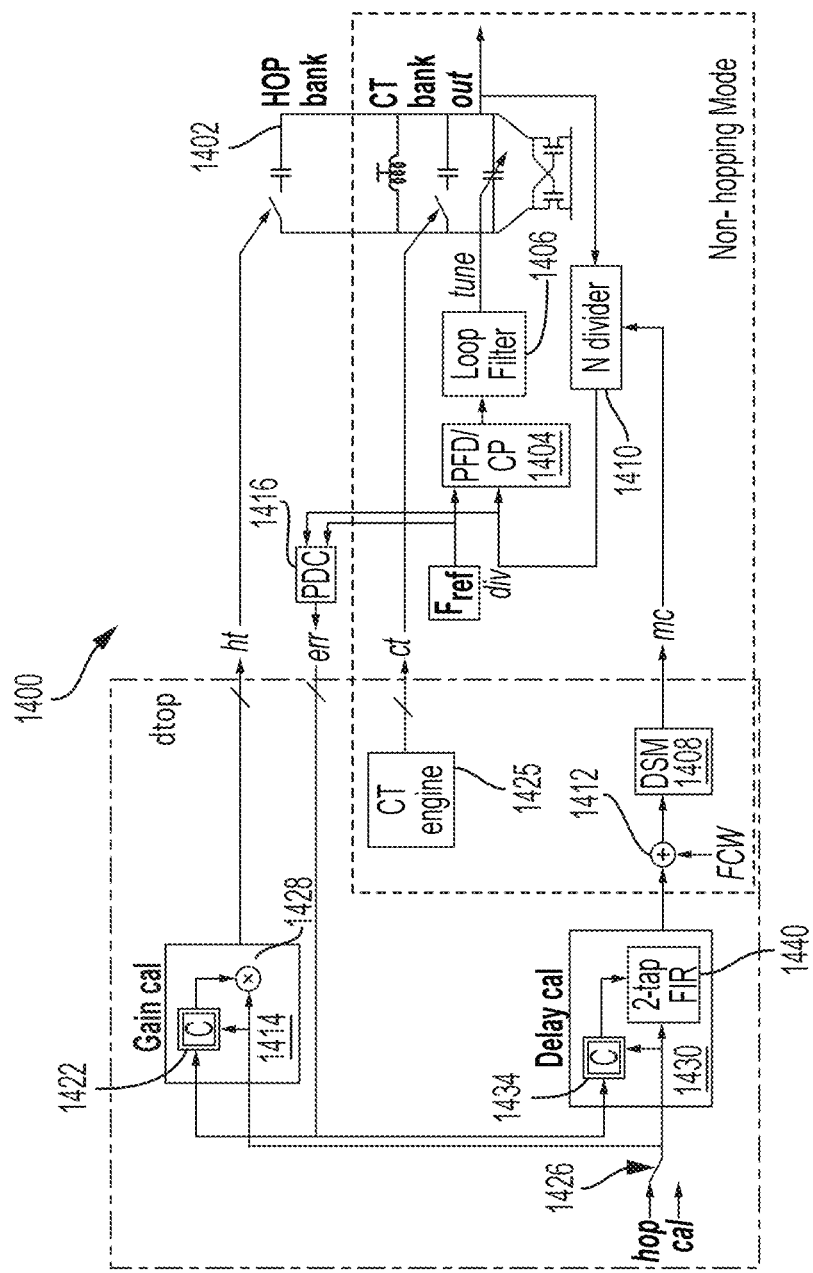
FIG. 14A illustrates a gain circuit and a delay calibration circuit of a phase lock loop system according to aspects of the present disclosure.

FIG. 14A illustrates a gain calibration circuit and a delay calibration circuit of a phase lock loop (PLL) system 1400 according to aspects of the present disclosure. A gain calibrator 1414 and delay calibrator 1430 may be coupled to a PLL to provide a gain calibration and delay calibration when the PLL is operating according to calibration mode. A switch device 1426 may cause the PLL system 1400 to switch between the calibration operation and frequency hopping operation. During the calibration operation, the calibration signal (cal) is provided to the gain calibrator 1414 and/or the delay calibrator 1430. For example, the gain calibrator 1414 receives an error signal (err) from a phase to digital converter (PDC) 1416. The error signal (err) may be based on a difference in phase between the reference signal $F_{ref}$ and the output signal (div) from the frequency divider 1410. The difference in phase between the reference signal $F_{ref}$ and the output signal (div) can also be determined at a phase detector 1404. A correlator 1422 at the gain calibrator 1414 correlates the error signal (err) with the calibration signal (cal) and determines a gain associated with the correlation.

The determined gain at the output of the correlator 1422 is multiplied with the calibration signal cal using a multiplier 1428 and the calibrated gain result at the output of the correlator 1422 is provided to a VCO 1402. The calibrated result at the high pass path to the VCO 1402 is determined to match the gain at the low pass path through a frequency divider 1410. In one aspect of the disclosure, the VCO 1402 is implemented in accordance with a switched capacitor bank (e.g., switched capacitor bank 700). The control for the switching of the capacitors of the switched capacitor bank is provided by a control engine 1425. The tuning voltage vtune from a loop filter 1406 controls variable capacitances of the switched capacitor bank.

When the PLL system 1400 is operating in accordance with a delay calibration mode, the delay calibrator 1430 receives the error signal (err) from the phase to digital converter (PDC) 1416. A delay correlator 1434 at the delay calibrator 1430 correlates the error signal (err) with the calibration signal (cal) and determines a delay coefficient. The delay coefficient and the delay calibration signal (cal) are provided to a filter (e.g., finite impulse response filter) 1440 in the delay calibrator 1430 for further processing. For example, a multiplier (not shown) multiplies the delay coefficient and the delay calibration signal (cal) to generate a signal that is filtered by the filter 1440. The filtered delay calibration signal is then provided to the low pass path of the PLL system 1400. For example, the filtered delay calibration signal is provided to the frequency divider 1410 to calibrate the frequency divider 1410. The filtered delay calibration signal may be provided to the frequency divider 1410 via a delta sigma modulator 1408 and a combiner 1412.

Figure 14B:
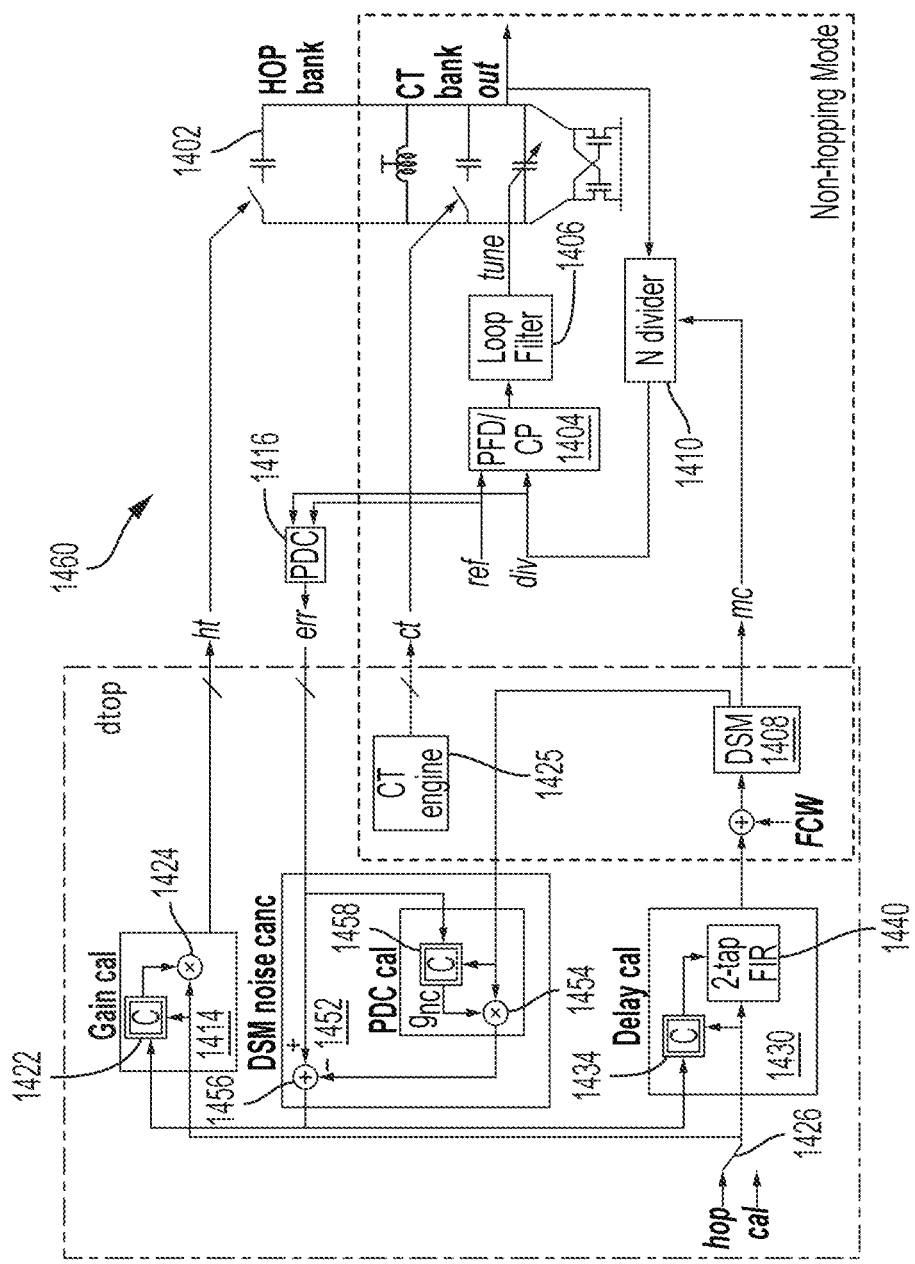
FIG. 14B illustrates another phase lock loop (PLL) system for speeding up calibration time according to aspects of the present disclosure.

FIG. 14B illustrates another phase lock loop (PLL) system 1460 for speeding up calibration time according to aspects of the present disclosure. FIG. 14A is similar to FIG. 14B, the difference is that FIG. 14B introduces a noise cancellation device while FIG. 14A does not include a noise cancellation implementation. The PLL system 1460 includes a noise cancellation device 1452 (e.g., a delta sigma modulator noise cancellation device). The noise cancellation device 1462 is introduced to speed up the time to perform the calibration. For example, the time to run the calibration processes from the error signal (err) is reduced. In some aspects of the present disclosure, the introduction of the noise cancellation device 1452 achieves a reduction or elimination of quantization error introduced by the delta sigma modulator 1408, improved signal to noise ratio, and speeds up the calibration. The implementation in the noise cancellation device 1452 is based on a correlation by a correlator 1458. In this case, however, the correlation is performed with an output of the delta sigma modulator 1408 and the error signal (err). The correlator 1458 provides a gain signal $g_{nc}$ that accounts for a gain of the path from the delta sigma modulator to the frequency divider 1410, to the phase to digital converter (PDC) 1416 and to the correlator 1458. The output of the delta sigma modulator 1408 is then multiplied with the gain signal $g_{nc}$ at a multiplier 1454. The result at the output of the multiplier 1454 is forwarded to a combiner 1456 where it is subtracted from the output of the phase to digital converter (PDC) 1416, which corresponds to the error signal (err), which speeds up the gain and delay calibration. The result at the output of the combiner is free from quantization error. For example, the result at the output of the combiner is free from DSM quantization error because the result at the output of the multiplier 1454 is subtracted from the output of the phase to digital converter (PDC) 1416, which corresponds to the error signal (err). Although the error signal after the combiner may be affected by other quantization error (for example PDC quantization error), the dominant quantization error (e.g., DSM quantization error) is removed or reduced.

Figure 15A:
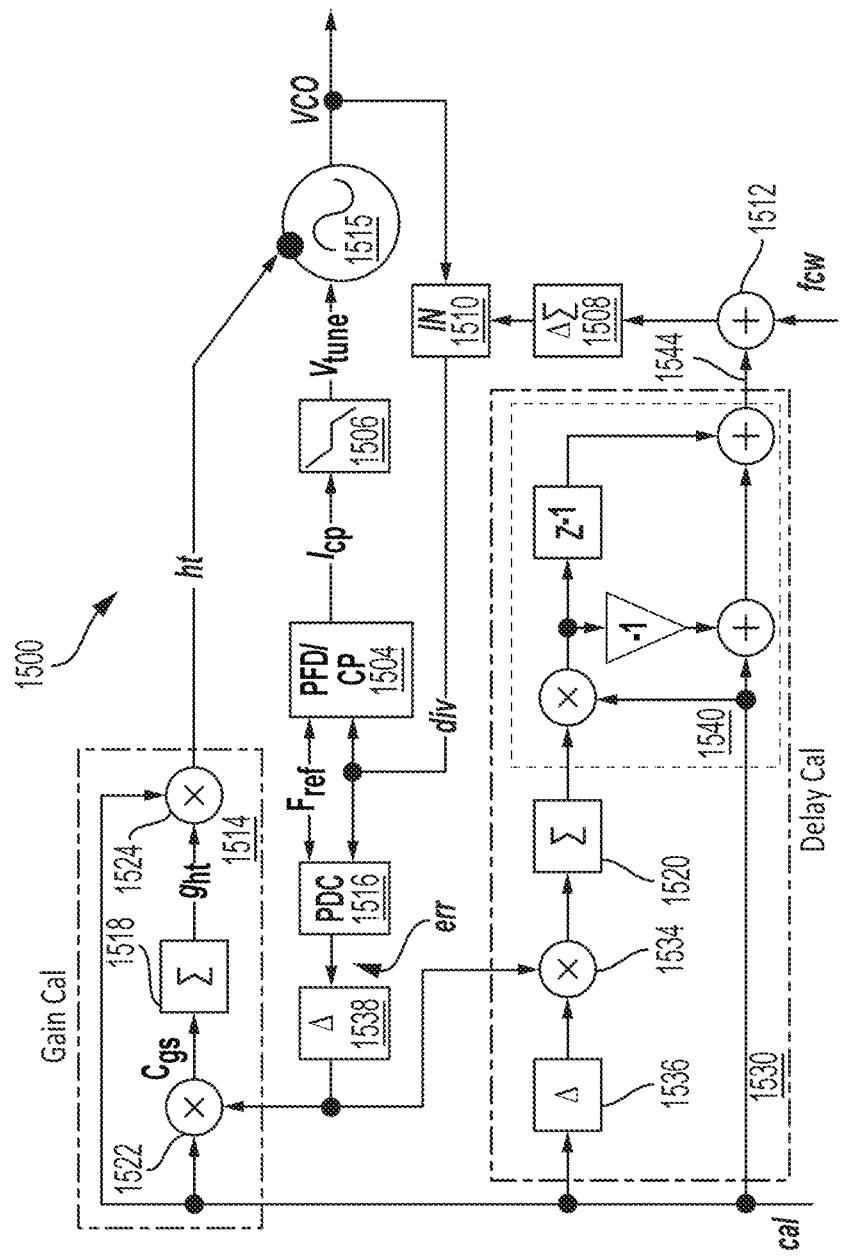
FIG. 15A is another illustration of gain and delay calibration of a phase lock loop system according to aspects of the present disclosure.

FIG. 15A is another illustration of gain and delay calibration of a phase lock loop system (PLL) 1500 according to aspects of the present disclosure. FIG. 15A shows further details of the implementation at a gain calibrator 1514 and a delay calibrator 1530 relative to the implementation of FIG. 14A. The gain calibrator 1514 and delay calibrator 1530 may be coupled to a PLL to provide a gain calibration signal $g_{ht}$ to a VCO 1502 and a delay calibration signal 1544 to the frequency divider 1510 in the calibration mode of operation. The delay calibration signal 1544 may be provided to the frequency divider 1510 via a combiner 1512 and a delta sigma modulator 1508. For example, the gain calibrator 1514 receives an error signal (err) from a phase to digital converter (PDC) 1516. The error signal may be based on a difference in phase between the reference signal $F_{ref}$ and the output signal (div) from the frequency divider 1510. The difference in phase between the reference signal $F_{ref}$ and the output signal (div) can also be determined at a phase detector 1504. A correlator 1522 at the gain calibrator 1514 correlates the error signal (err) with a gain calibration signal (cal) and determines a gain associated with the correlation. A product of the determined gain and the gain calibration signal is determined at a multiplier 1524 and the result is provided to the VCO 1502 to calibrate the gain of the VCO 1502.

The delay calibrator 1530 receives the error signal (err) from the phase to digital converter (PDC) 1516. A delay correlator at the delay calibrator correlates the error signal with a delay calibration signal and determines a delay coefficient. The delay coefficient and the delay calibration signal 1544 are provided to a filter (e.g., finite impulse response filter) 1540 in the delay calibrator 1530. A filtered delay calibration signal is then provided to the frequency divider 1510 to calibrate the frequency divider 1510 and corresponding low pass path for delay deficiencies. The filtered delay calibration signal may be provided to the frequency divider 1510 via a delta sigma modulator 1508 and a combiner 1512.

In one aspect of the disclosure, the VCO 1502 may be implemented in accordance with a switched capacitor bank (e.g., switched capacitor bank 700). For example; the tuning voltage vtune from a loop filter 1506 controls variable capacitances of the switched capacitor bank. The output frequency of the VCO 1502 is controlled by the resulting gain signal from the gain calibrator 1514. To calibrate the gain, the reference signal $F_{ref}$ and the output signal (div) from the frequency divider 1510 are provided to the phase to digital converter (PDC) 1516. The gain calibrator 1514 receives an error signal (err) from the phase to digital converter 1516. In one implementation, the error signal (err) may be provided to a differentiator 1538 prior to reception at the gain calibrator 1514. The differentiator 1538 differentiates the error signal (err) that is the output of the phase to digital converter 1516. The error signal may be based on a difference in phase between the reference signal $F_{ref}$ and the output signal (div) from the frequency divider 1510. The error signal (err) may be converted into a digital word by the phase to digital converter 1516.

The gain calibration is achieved based on a correlation implementation at the gain calibrator 1514 that receives the error signal (err) (or integrated error signal (err)) and a calibration signal (cal). In some implementations, the calibration signal (cal) may be a periodic square wave. For example, the correlation is performed with the error signal (err) (or integrated error signal (err)) and a calibration signal (cal) at the correlator 1522. The correlator 1522 provides a correlated gain signal $c_{gs}$. The correlator 1522 determines the correlated gain signal $c_{gs}$ such that the error signal (err) correlates to the calibration signal (cal). The correlated gain signal $c_{gs}$ is provided to an integrator 1518, which generates a gain estimation signal $g_{ht}$ for the high pass path. The gain estimation signal $g_{ht}$ is then multiplied with the calibration signal (cal) at the multiplier 1524 to generate a calibrated gain estimation signal ht to the VCO 1502. During the calibration, the system operates in accordance with a configuration (e.g., mission mode) such as a 2-point modulation scheme where a training waveform is applied at both the frequency divider and the VCO inputs. At the input of the VCO the training waveform is properly scaled by the gain estimation signal $g_{ht}$. To compensate for a gain mismatch at the VCO 1502, the frequency step injected at the input port 1515 of the VCO 1502 is multiplied by a gain factor, g (e.g., gain estimation signal $g_{ht}$). The gain estimation signal $g_{ht}$ is determined such that the gain of the high pass path is substantially equivalent to the gain of the low pass path.

To calibrate the delay, the reference signal $F_{ref}$ and the output signal (div) from the frequency divider 1510 are provided to the phase to digital converter (PDC) 1516. The delay calibrator 1530 receives the error signal (err) from the phase to digital converter 1516. In one implementation, the error signal (err) may be provided to the differentiator 1538 prior to reception at the gain calibrator 1514 and the delay calibrator 1530. The delay calibration is achieved based on correlation at a correlator 1534 that receives the error signal (err) (or integrated error signal (err)) and the calibration signal (cal). In one implementation, the calibration signal (cal) may be provided to a differentiator 1536 prior to reception at the correlator 1534. In some implementations, the calibration signal (cal) may be a periodic square wave.

The correlator 1534 determines a correlated delay signal such that the error signal (err) correlates to the calibration signal (cal). The correlated delay signal, which is the product of the error signal (err) and the delay calibration signal, is provided to the frequency divider 1510 as a delay calibration signal. For example, when the periodic square wave of the calibration signal (cal) is processed through the differentiator 1536, the values at the output of the differentiator 1536 are zero except for values that correspond to rising and falling edges of the periodic square wave of the calibration signal (cal). The error signal (err) (or integrated error signal (err)) is correlated with the output of the differentiator 1536 and the result accumulated at an accumulator 1520. For example, the error signal (err) (or integrated error signal (err)) that coincides with the rising and the falling edges of the periodic square wave of the calibration signal (cal) are accumulated in the accumulator 1520.

The delay calibration tunes the coefficient of a finite impulse response (FIR) filter. In the low pass path, the calibration signal or frequency step in mission mode passes through the FIR filter with coefficients based on the delay calibration. In one aspect of the disclosure, the correlated delay signal is filtered prior to reception at the frequency divider 1510. In one implementation, a filter 1540 (e.g., FIR filter) may be included in the delay calibrator 1530 to filter the correlated delay signal. In other implementations, the filter 1540 may be external but coupled to the delay calibrator 1530. The filter provides a digital delay. The filtered delay signal may be provided to the low pass path. For example, the filtered delay signal may be received by the frequency divider 1510 via a combiner 1512 and the delta sigma modulator 1508 and then passed on to the frequency divider 1510. The filtered delay signal may be applied to the frequency divider 1510 to mitigate delays associated with application of the first and second frequency steps.

Figure 15B:
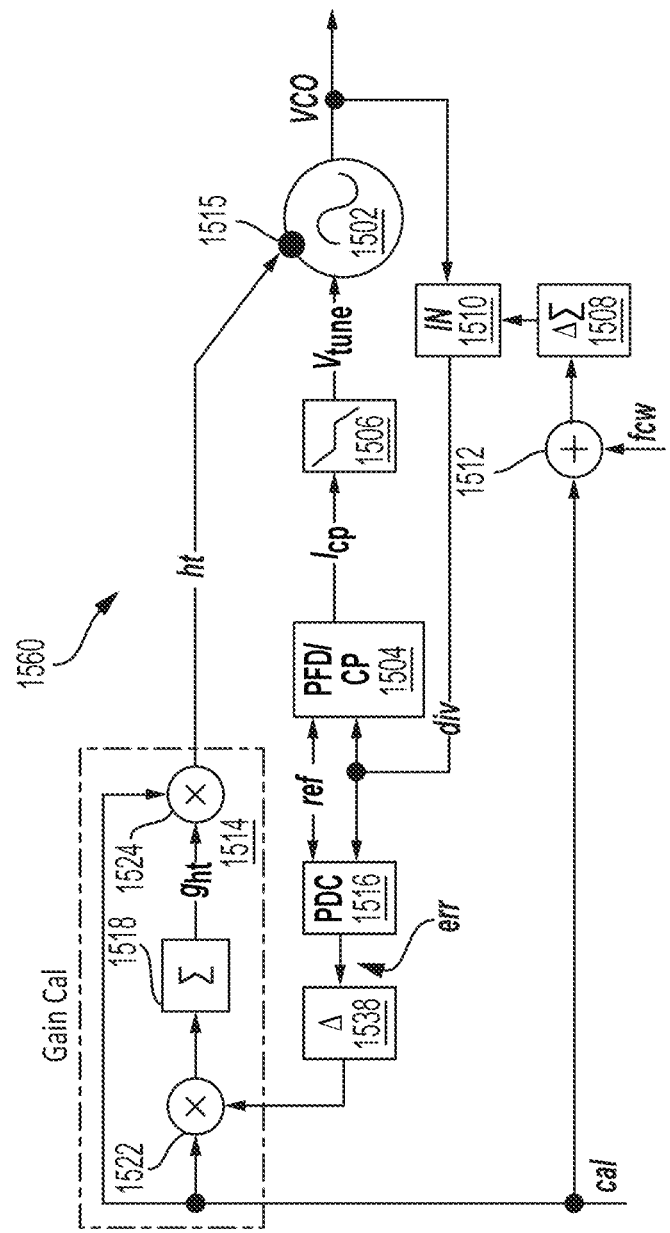
FIG. 15B illustrates gain and delay calibration of a phase lock loop system according to aspects of the present disclosure.

FIG. 15B illustrates gain calibration of a phase lock loop system (PLL) 1560 according to aspects of the present disclosure. FIG. 15B is similar to FIG. 15A. The difference between the two figures is that FIG. 15B is directed to gain calibration while FIG. 15A is directed to both gain and delay calibration. To implement the gain calibration only, the calibration signal cal is provided to the gain calibrator 1514 and to the combiner 1512. The gain estimation signal $g_{ht}$ is multiplied with the calibration signal (cal) at the multiplier 1524 to generate the calibrated gain estimation signal $g_{ht}$ to the VCO 1502.

Figure 16:
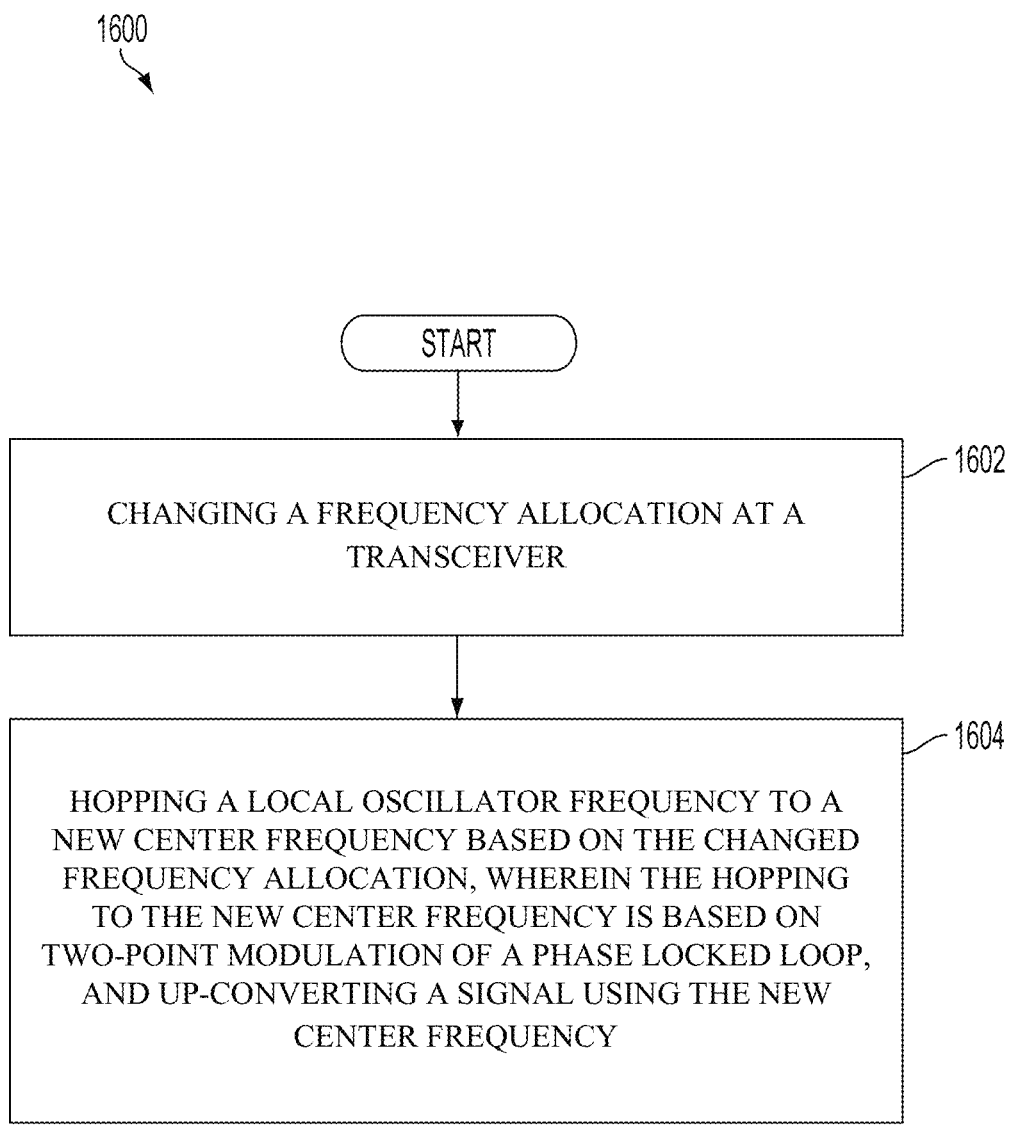
FIG. 16 is a process flow diagram illustrating a fast frequency hopping method for a phase locked loop according to an aspect of the present disclosure.

FIG. 16 is a process flow diagram illustrating a fast frequency hopping method 1600 for a phase locked loop according to an aspect of the present disclosure. At block 1602, frequency allocation at a transmitter/receiver is changed. At block 1604, a local oscillator frequency hops to a new center frequency based on the changed frequency allocation. The hopping to the new center frequency is based on two-point modulation of a phase locked loop to up-convert a signal using the new center frequency.

According to a further aspect of the present disclosure, a phase locked loop is described. The phased locked loop includes means for generating a phase locked loop reference frequency. The reference frequency generating means may be the control unit 210, as shown in FIGS. 2 and 3 and a local oscillator (not shown). The phased locked loop also includes means for detecting a phase difference between a first frequency and a second frequency. The phase difference detecting means may be the control unit, shown in FIGS. 2 and 3, a phase detector and an analog multiplier or mixer. In another aspect, the aforementioned means may be any module or any apparatus configured to perform the functions recited by the aforementioned means.

Figure 17:
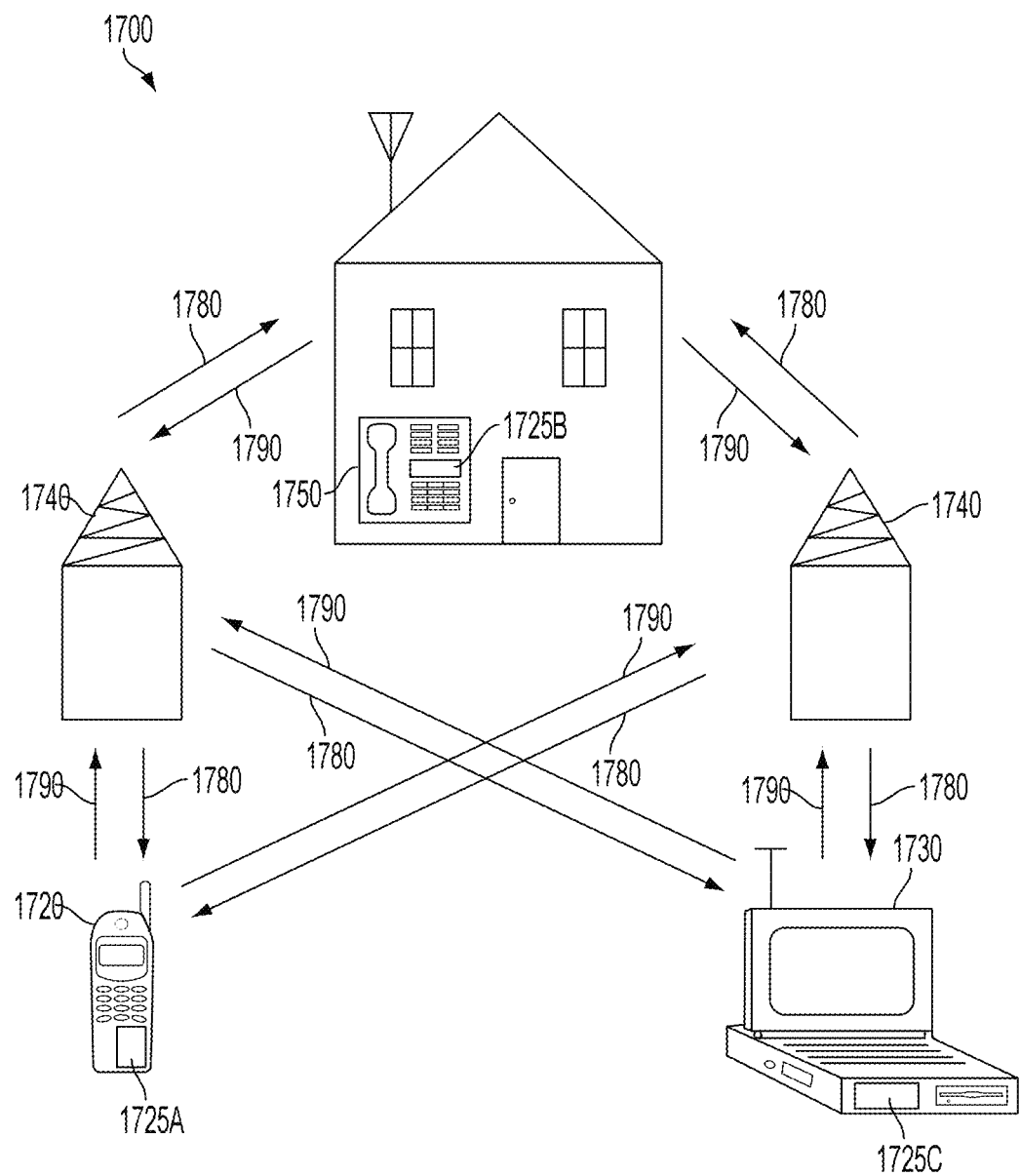
FIG. 17 is a block diagram showing an exemplary wireless communication system in which an aspect of the disclosure may be advantageously employed.

FIG. 17 is a block diagram showing an exemplary wireless communication system 1700 in which an aspect of the disclosure may be advantageously employed. For purposes of illustration, FIG. 17 shows three remote units 1720, 1730, and 1750 and two base stations 1740. It will be recognized that wireless communication systems may have many more remote units and base stations. Remote units 1720, 1730, and 1750 include IC devices 1725A, 1725C, and 1725B that include the disclosed phased lock loop. It will be recognized that other devices may also include the disclosed phased lock loop, such as the base stations, user equipment, and network equipment. FIG. 17 shows forward link signals 1780 from the base station 1740 to the remote units 1720, 1730, and 1750 and reverse link signals 1790 from the remote units 1720, 1730, and 1750 to base station 1740.

In FIG. 17, remote unit 1720 is shown as a mobile telephone, remote unit 1730 is shown as a portable computer, and remote unit 1750 is shown as a fixed location remote unit in a wireless local loop system. For example, a remote units may be a mobile phone, a hand-held personal communication systems (PCS) unit, a portable data unit such as a personal digital assistant (PDA), a GPS enabled device, a navigation device, a set top box, a music player, a video player, an entertainment unit, a fixed location data unit such as a meter reading equipment, or other communications device that stores or retrieve data or computer instructions, or combinations thereof. Although FIG. 17 illustrates remote units according to the aspects of the disclosure, the disclosure is not limited to these exemplary illustrated units. Aspects of the disclosure may be suitably employed in many devices, which include the disclosed phased lock loop module.

The accompanying claims and their equivalents are intended to cover such forms or modifications as would fall within the scope and spirit of the protection. For example, the example apparatuses, methods, and systems disclosed herein may be applied to multi-SIM wireless devices subscribing to multiple communication networks and/or communication technologies. The various components illustrated in the figures may be implemented as, for example, but not limited to, software and/or firmware on a processor, ASIC/FPGA/DSP, or dedicated hardware. Also, the features and attributes of the specific example aspects disclosed above may be combined in different ways to form additional aspects, all of which fall within the scope of the present disclosure.

The foregoing method descriptions and the process flow diagrams are provided merely as illustrative examples and are not intended to require or imply that the operations of the method must be performed in the order presented. Certain of the operations may be performed in various orders. Words such as "thereafter," "then," "next," etc., are not intended to limit the order of the operations; these words are simply used to guide the reader through the description of the methods.

The various illustrative logical blocks, modules, circuits, and operations described in connection with the aspects disclosed herein may be implemented as electronic hardware, computer software, or combinations of both. To clearly illustrate this interchangeability of hardware and software, various illustrative components, blocks, modules, circuits, and operations have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The hardware used to implement the various illustrative logics, logical blocks, modules, and circuits described in connection with the various aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of receiver devices, e.g., a combination of a DSP and a microprocessor, a plurality of microprocessors, one or more microprocessors in conjunction with a DSP core, or any other such configuration. Alternatively, some operations or methods may be performed by circuitry that is specific to a given function.

In one or more exemplary aspects, the functions described may be implemented in hardware, software, firmware, or any combination thereof. If implemented in software, the functions may be stored as one or more instructions or code on a non-transitory computer-readable storage medium or non-transitory processor-readable storage medium. The operations of a method or algorithm disclosed herein may be embodied in processor-executable instructions that may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable storage media may include random access memory (RAM), read-only memory (ROM), electrically erasable programmable read-only memory (EEPROM), FLASH memory, CD-ROM or other optical disk storage, magnetic disk storage or other magnetic storage devices, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable storage medium and/or computer-readable storage medium, which may be incorporated into a computer program product.

Although the present disclosure provides certain example aspects and applications, other aspects that are apparent to those of ordinary skill in the art, including aspects which do not provide all of the features and advantages set forth herein, are also within the scope of this disclosure. Accordingly, the scope of the present disclosure is intended to be defined only by reference to the appended claims.

What is claimed is:

1. A method for wireless communication comprising:
    changing a frequency allocation at a transceiver;
    applying a tuning voltage to a first input port of a voltage controlled oscillator (VCO) of a phase locked loop; and
    hopping a local oscillator frequency to a new center frequency based at least in part on the changed frequency allocation, the hopping to the new center frequency based at least in part on a frequency adjustment in baseband including applying a first frequency adjustment signal to a second input port of the VCO.

2. The method of claim 1, further comprising calibrating a two-point modulation of the phase locked loop.

3. The method of claim 2, in which the calibrating comprises a gain calibration.

4. The method of claim 2, in which the calibrating comprises a delay calibration.

5. The method of claim 1 further comprising cancelling at least a portion of noise generated by a delta-sigma modulator.

6. The method of claim 2, in which the two-point modulation comprises modulating the phase locked loop through a high pass path.

7. The method of claim 6, in which the two-point modulation further comprises modulating the phase locked loop through a low pass path.

8. The method of claim 1, further comprising receiving a resource allocation message from a base station, the resource allocation message comprising frequency allocation information.

9. The method of claim 1, further comprising up-converting a signal using the new center frequency.

10. An apparatus for wireless communication comprising:
    a local oscillator;
    a phase detector coupled to the local oscillator, the local oscillator operable to receive a reference frequency for a transceiver;
    a voltage controlled oscillator (VCO) coupled to the phase detector, the VCO including a first input port and a second input port to respectively receive a tuning voltage and a first frequency adjustment signal;
    a frequency divider coupled to the VCO and to the phase detector to complete a feedback loop of a phase locked loop; and
    a control unit coupled to the local oscillator, the control unit operable to determine a change in frequency allocation at the transceiver, the control unit operable to cause the local oscillator to hop from the reference frequency to a new center frequency based at least in part on the changed frequency allocation, the hopping to the new center frequency based at least in part on a frequency adjustment in baseband where the first frequency adjustment signal is applied to the second input port of the VCO.

11. The apparatus of claim 10, further comprising a calibration circuit operable to calibrate a two-point modulation of the phase locked loop.

12. The apparatus of claim 11, in which the calibration circuit further comprises a gain calibration circuit.

13. The apparatus of claim 11, in which the calibration circuit further comprises a delay calibration circuit.

14. The apparatus of claim 10, further comprising a filter to cancel at least a portion of noise generated by a delta-sigma modulator.

15. The apparatus of claim 10, in which the control unit is coupled to the VCO to cause the first frequency adjustment signal to be provided to the VCO to modulate the phase locked loop through a high pass path.

16. The apparatus of claim 15, in which the control unit is coupled to the VCO to cause a second frequency adjustment signal to be provided to the frequency divider to modulate the phase locked loop through a low pass path.

17. The apparatus of claim 10, further comprising a receiver coupled to the control unit to receive a resource allocation message from a base station, the resource allocation message comprising frequency allocation information.

18. The apparatus of claim 10, in which the phase detector is further configured to up-convert a signal using the new center frequency.

19. An apparatus for wireless communication comprising:
means for generating a phase locked loop reference frequency;
means for detecting a phase difference between a first frequency and a second frequency, the phase difference detecting means coupled to the phase locked loop reference frequency generating means, the phase locked loop reference frequency generation means operable to receive an original reference frequency for a transceiver;
a voltage controlled oscillator (VCO) coupled to the phase difference detecting means, the VCO including a first input port and a second input port to respectively receive a tuning voltage and a first frequency adjustment signal;
a frequency divider coupled to the VCO and to the phase difference detecting means to complete a feedback loop of a phase locked loop; and
control means for determining a frequency change allocation at the transceiver, coupled to the phase locked loop reference frequency generation means, the control means comprising means for causing the reference frequency generation means to hop from the original reference frequency to a new center frequency based at least in part on the changed frequency allocation, the hopping to the new center frequency based at least in part on a frequency adjustment in baseband where the first frequency adjustment signal is applied to the second input port of the VCO.

20. The apparatus of claim 19, further comprising means for calibrating a two-point modulation of the phase locked loop.

21. The apparatus of claim 20, in which the calibration means further comprises gain calibration means.

22. The apparatus of claim 20, in which the calibration means further comprises delay calibration means.

23. The apparatus of claim 19, further comprising means for cancelling at least a portion of noise generated by a delta-sigma modulator.

24. The apparatus of claim 19, further comprising a receiver coupled to the control means to receive a resource allocation message from a base station, the resource allocation message comprising frequency allocation information.

* * * * *